US008723540B2

(12) United States Patent
Yamamoto et al.

(10) Patent No.: US 8,723,540 B2
(45) Date of Patent: May 13, 2014

(54) CONTACT PROBE AND SOCKET

(75) Inventors: Tsugio Yamamoto, Gunma (JP); Takeshi Todoroki, Gunma (JP)

(73) Assignee: Yokowo Co., Ltd., Tokyo (JP)

( * ) Notice: Subject to any disclaimer, the term of this patent is extended or adjusted under 35 U.S.C. 154(b) by 166 days.

(21) Appl. No.: 13/351,843

(22) Filed: Jan. 17, 2012

(65) Prior Publication Data

US 2012/0182036 A1   Jul. 19, 2012

(30) Foreign Application Priority Data

Jan. 17, 2011 (JP) ................................. 2011-007332

(51) Int. Cl.
*G01R 31/20* (2006.01)

(52) U.S. Cl.
USPC .................................................... 324/754.11

(58) Field of Classification Search
USPC ................. 324/762.01–762.1, 754.01–754.3, 324/755.01–755.11; 257/48
See application file for complete search history.

(56) References Cited

U.S. PATENT DOCUMENTS

| | | | |
|---|---|---|---|
| 4,385,754 A | 5/1983 | Waite | |
| 5,174,763 A | 12/1992 | Wilson | |
| 5,990,697 A * | 11/1999 | Kazama | .................. 324/755.05 |
| 6,396,293 B1 | 5/2002 | Vinther et al. | |
| 6,462,567 B1 | 10/2002 | Vinther et al. | |
| 6,506,082 B1 | 1/2003 | Meek et al. | |
| 6,685,492 B2 * | 2/2004 | Winter et al. | .................. 439/219 |
| 6,769,919 B2 | 8/2004 | Kosmala | |
| 6,821,131 B2 | 11/2004 | Suzuki et al. | |
| 7,025,602 B1 | 4/2006 | Hwang | |
| 7,256,593 B2 | 8/2007 | Treibergs | |
| 7,467,952 B2 | 12/2008 | Hsiao et al. | |
| 7,545,159 B2 | 6/2009 | Winter | |
| 7,559,769 B2 | 7/2009 | Hsiao et al. | |
| 7,559,806 B2 | 7/2009 | Lin et al. | |
| 7,626,408 B1 | 12/2009 | Kaashoek | |

(Continued)

FOREIGN PATENT DOCUMENTS

| | | |
|---|---|---|
| JP | 4-270967 | 9/1992 |
| JP | 6-28699 U | 8/1994 |
| JP | 2008-45986 | 2/2008 |
| JP | 2010-025844 | 2/2010 |

OTHER PUBLICATIONS

USPTO Office Action dated Aug. 20, 2012 in counterpart U.S. Appl. No. 12/767,391.

(Continued)

*Primary Examiner* — Tung X Nguyen
(74) *Attorney, Agent, or Firm* — Morgan, Lewis & Bockius LLP

(57) ABSTRACT

A contact probe includes: a first and second plungers, one of the first and second plungers being connected to an object to be inspected, the other being connected to an inspecting board; and a spring urging the first and second plungers so as to be separated from each other. The first plunger includes a distal end side columnar part and a flange part. The flange part includes a first portion that has a first length from a center point, which is, greater than a radius of the distal end side columnar part, in a first direction perpendicular to an axial direction, and includes a second portion that has a second length from the center point, which is smaller than the radius of the distal end side columnar part, in a second direction perpendicular to the axial direction and different from the first direction.

7 Claims, 18 Drawing Sheets

(56) References Cited

U.S. PATENT DOCUMENTS

| | | |
|---|---|---|
| 7,772,865 B2 | 8/2010 | Tan |
| 7,789,671 B2 | 9/2010 | Hsieh et al. |
| 7,841,864 B2 | 11/2010 | Hsiao et al. |
| 7,845,988 B2 | 12/2010 | Hsiao et al. |
| 7,868,635 B2 | 1/2011 | Ishizuka |
| 7,946,855 B2 | 5/2011 | Osato |
| 7,972,184 B2 | 7/2011 | Hsieh et al. |
| 8,310,255 B2 | 11/2012 | Shiga |
| 8,344,747 B2 | 1/2013 | Kazama et al. |
| 2008/0042676 A1 | 2/2008 | Yamada et al. |
| 2010/0123476 A1 | 5/2010 | Kazama et al. |

OTHER PUBLICATIONS

USPTO Office Action dated Jan. 11, 2013 in counterpart U.S. Appl. No. 12/767,391.

\* cited by examiner

FIG. 1(A)
STATE OF STANDBY
FIG. 1(B)
STATE WHERE KELVIN MEASUREMENT IS CARRIED OUT
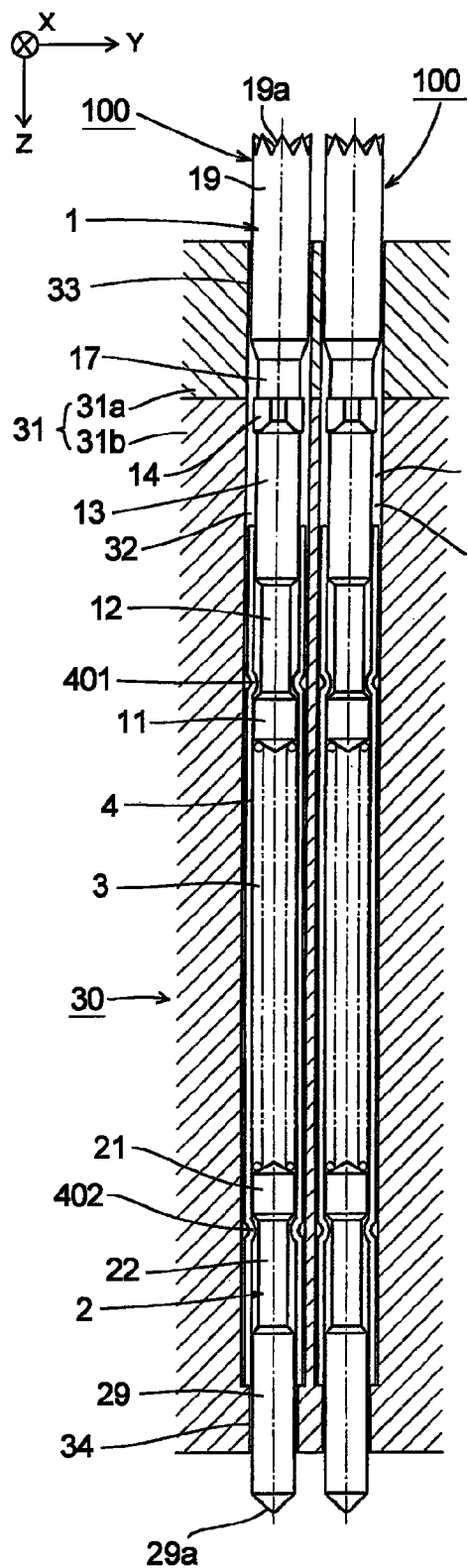
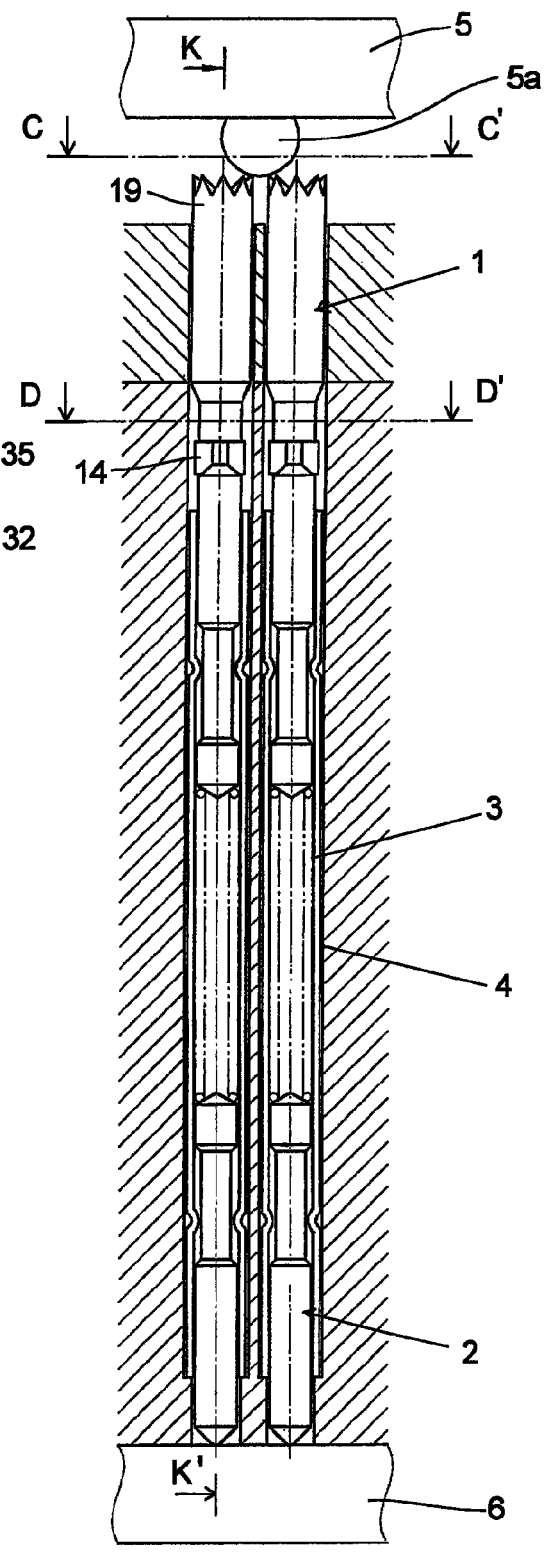

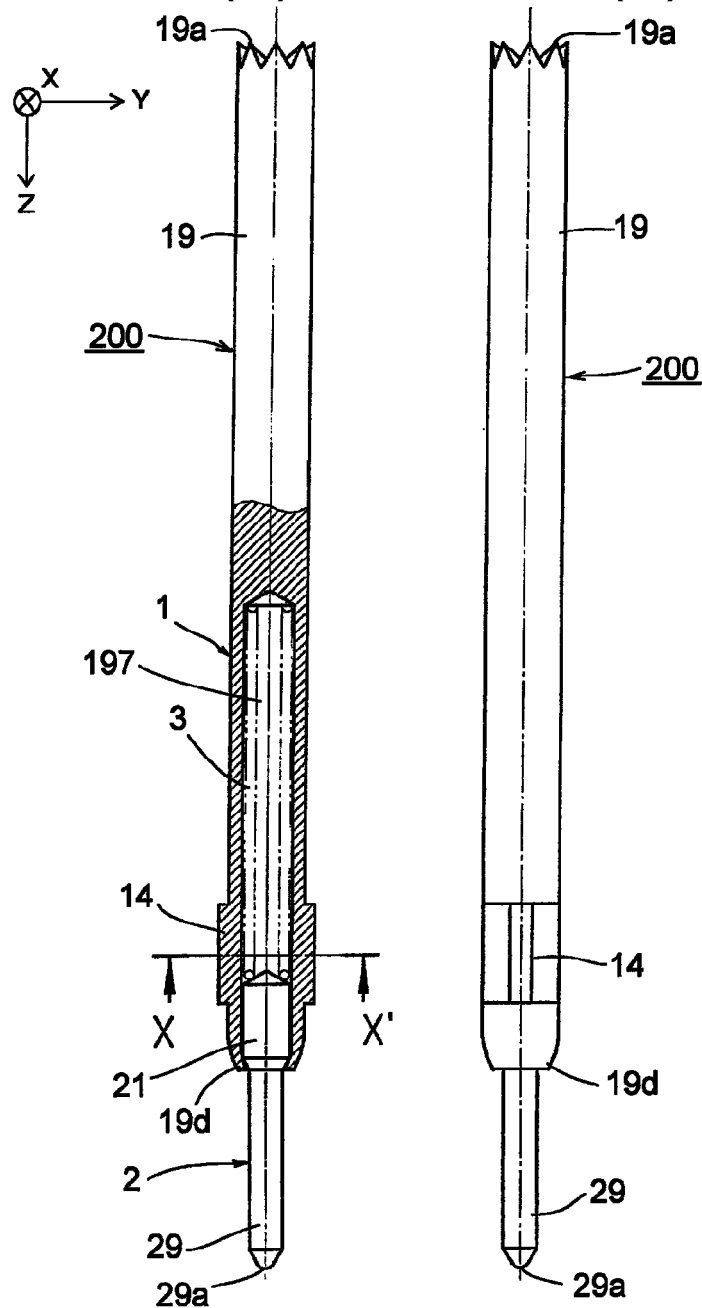
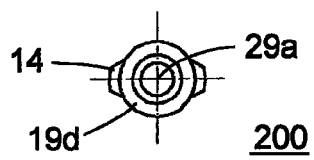
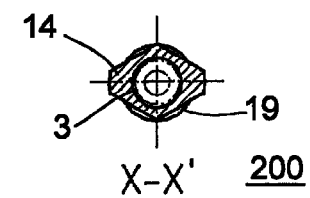

K-K'

FIG. 17(A)
STATE OF STANDBY
FIG. 17(B)
STATE WHERE KELVIN MEASUREMENT IS CARRIED OUT
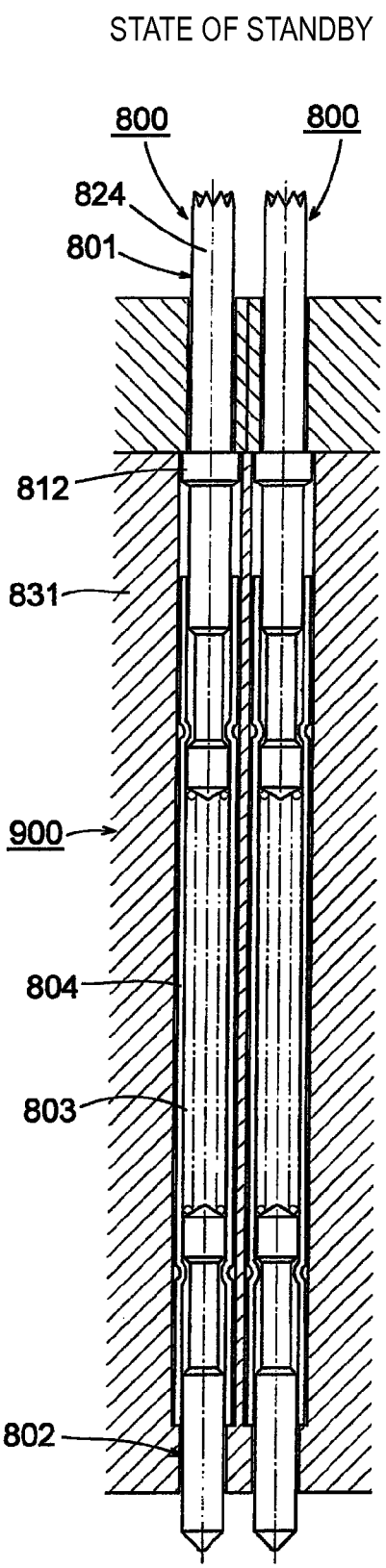
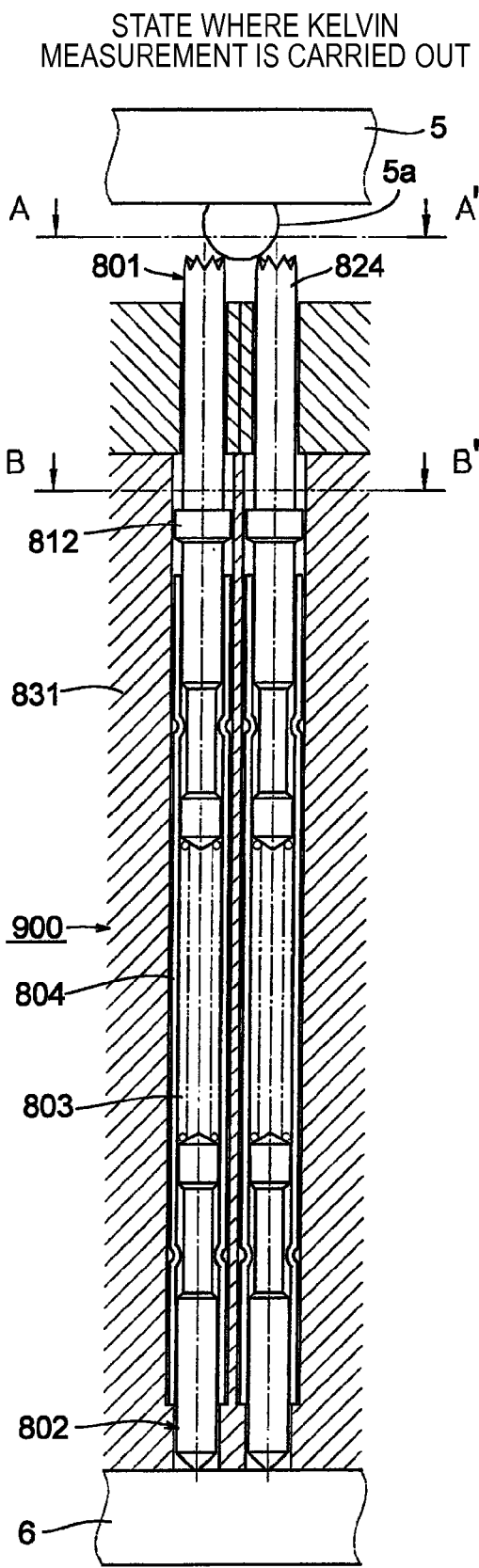

CONTACT PROBE AND SOCKET

BACKGROUND OF THE INVENTION

The present invention relates to a contact probe and a socket to be used for inspecting a device to be inspected such as a semiconductor integrated circuit.

In case of inspecting an object to be inspected such as a semiconductor integrated circuit, contact probes are generally used for electrically connecting the object to be inspected to an inspecting board at a side of a measuring instrument.

FIG. 17(A) is a sectional front view of a socket 900 in which related-art contact probes 800 are supported by an insulating support body 831 in a state of standby (in a state where springs are released), and FIG. 17(B) is a sectional front view of the same in a state where Kelvin measurement is carried out (in a state where the springs are contracted). It is to be noted that in the drawings, first plungers 801 and second plungers 802 of the respective contact probes 800 are not shown in section.

The socket 900 which is shown in the drawings is to be used for Kelvin measurement. The Kelvin measurement is a method for measuring electrical performance by bringing a current supplying probe and a voltage monitoring probe into contact with an electrode of an object 5 to be inspected, for example, an electrode bump 5a (Reference should be made to JP-A-2008-45986, according to necessity). In the socket 900, one of the two contact probes 800 having the mutually same structure is used as the current supplying probe, and the other is used as the voltage monitoring probe.

Each of the contact probes 800 is provided with the first plunger 801, the second plunger 802, a spring 803, and a tube 804. The first plunger 801 is a component to be connected to the object 5 to be inspected, and the second plunger 802 is a component to be connected to an inspection board 6 (adapted to be connected to a measuring instrument, which is not shown). A flange part 812 of the first plunger 801 in a shape of a disc having a larger diameter than a distal end side columnar part 824 is provided for preventing withdrawal of the contact probe 800 in a state as shown in FIG. 17(A), and for aligning a projecting length of the distal end side columnar part 824. A distal end face of the distal end side columnar part 824 is split into angled shapes (herein, split in eight), and there are eight apexes of the angled shapes along an outer circumference, at an equal angle from the center.

In the contact probe 800 as shown in FIGS. 17(A) and 17(B), the flange part 812 protrudes toward the adjacent contact probe 800, and therefore, the two adjacent contact probes 800 are unable to be disposed in a manner that their distal end side columnar parts 824 may stand close to each other. Accordingly, a contact pitch, which will be described below, cannot be made smaller.

FIG. 18(A) is a view as seen from a direction of arrow marks A-A' in FIG. 17(B). FIG. 18(B) is a sectional view taken along a line B-B' in FIG. 17(B). FIG. 19 is an enlarged view of a region surrounding distal end parts of the first plungers 801 in FIGS. 17(A) and 17(B). Referring to these drawings, a contact pitch P1 between the adjacent contact probes 800 will be described.

The contact pitch P1 is represented by the following equation.

$$P1 = E + (F \times 2) + (G \times 2) + (H \times 2) \quad \text{Equation 1}$$

E: the smallest wall thickness of the insulating support body 831

F: a gap between the insulating support body 831 and a side face of the flange part 812

G: a difference in radius between the flange part 812 and the distal end side columnar part 824

H: a distance from a side face of the distal end side columnar part 824 (the side face which is the closest to the adjacent columnar part 824) to the apex of the angled shape of the distal end face. This distance is a distance measured along a direction interconnecting the adjacent contact probes 800. Although this distance may be zero, in some cases, depending on a rotation angle of the distal end side columnar part 824, the distance is herein deemed as the largest distance (in a state of FIG. 18(A)).

As describe above, protrusion of the flange part 812 directly affects the contact pitch P1, and makes it difficult to achieve the smaller contact pitch. It is to be noted that the lengths E and F out of the aforesaid lengths E to H are unable to be made zero for designing reason.

SUMMARY

It is therefore an object of the invention to provide a contact probe and a socket in which a contact pitch can be made smaller as compared with a related-art case.

In order to achieve the object, according to the invention, there is provided a contact probe comprising: a first plunger and a second plunger which are electrically connected to each other, one of the first and second plungers being adapted to be connected to an object to be inspected, the other of the first and second plungers being adapted to be connected to an inspecting board; and a spring provided for the first and second plungers to urge the first and second plungers so as to be separated from each other, wherein: the first plunger includes a distal end side columnar part, and a flange part which is provided at a side of a base end at a distance from a distal end; and the flange part includes a first portion that has a first length from a center point of the flange part, which is greater than a radius of the distal end side columnar part, in a first direction perpendicular to an axial direction, and includes a second portion that has a second length from the center point, which is smaller than the radius of the distal end side columnar part, in a second direction perpendicular to the axial direction and different from the first direction.

The flange part may include a third portion that has a third length, which is greater than a diameter of the distal end side columnar part, in the first direction, and include a fourth portion that has a fourth length from, which is smaller than the diameter of the distal end side columnar part, in the second direction.

The first plunger may include a small diameter part between the flange part and the distal end side columnar part, the small diameter part being in contact with a distal end face of the flange part, and having a smaller diameter than the distal end side columnar part.

According to the invention, there is also provided a socket comprising: a plurality of the contact probe; and an insulating support body which supports the plurality of the contact probe, wherein the second portion of one of adjacent two of the plurality of the contact probe is opposed to the second portion of the other of the adjacent two of the plurality of the contact probe.

According to the invention, there is also provided a socket comprising: a plurality of the contact probe; and an insulating support body which supports the plurality of the contact probe, wherein: adjacent two of the plurality of the contact probe which are arranged in a third direction perpendicular to the axial direction and the first direction are a first contact probe and a second contact probe; and the first and second contact probes are offset from each other in the first direction.

A line interconnecting the first and second contact probes may lie at an angle of about 45 degrees with respect to the first direction.

Both ends of the third portion of each of the plurality of the contact probe may be tapered.

It is to be noted that arbitrary combinations of the constituent elements as described above, and expressions of the invention which have been converted between methods and systems are also effective as the aspects of the invention.

BRIEF DESCRIPTION OF THE DRAWINGS

FIG. 1(A) is a sectional front view of a socket in which contact probes according to a first embodiment of the invention are supported by an insulating support body, in a state of standby (in a state where springs are released), and FIG. 1(B) is a sectional front view of the same in a state where Kelvin measurement is carried out (in a state where the springs are contracted).

FIG. 10(A) is a front view for explaining a shape of a contact probe according to a second embodiment of the invention, a part of which is shown in section, FIG. 10(B) is a right side view of the contact probe, FIG. 10(C) is a bottom view of the contact probe, and FIG. 10(D) is a sectional view taken along a line X-X' in FIG. 10(A).

FIG. 17(A) is a sectional front view of a socket in which related-art contact probes are supported by an insulating support body in a state of standby (in a state where springs are released), and FIG. 17(B) is a sectional front view of the same in a state where Kelvin measurement is carried out (in a state where the springs are contracted).

DETAILED DESCRIPTION OF EMBODIMENTS

Figure 2:
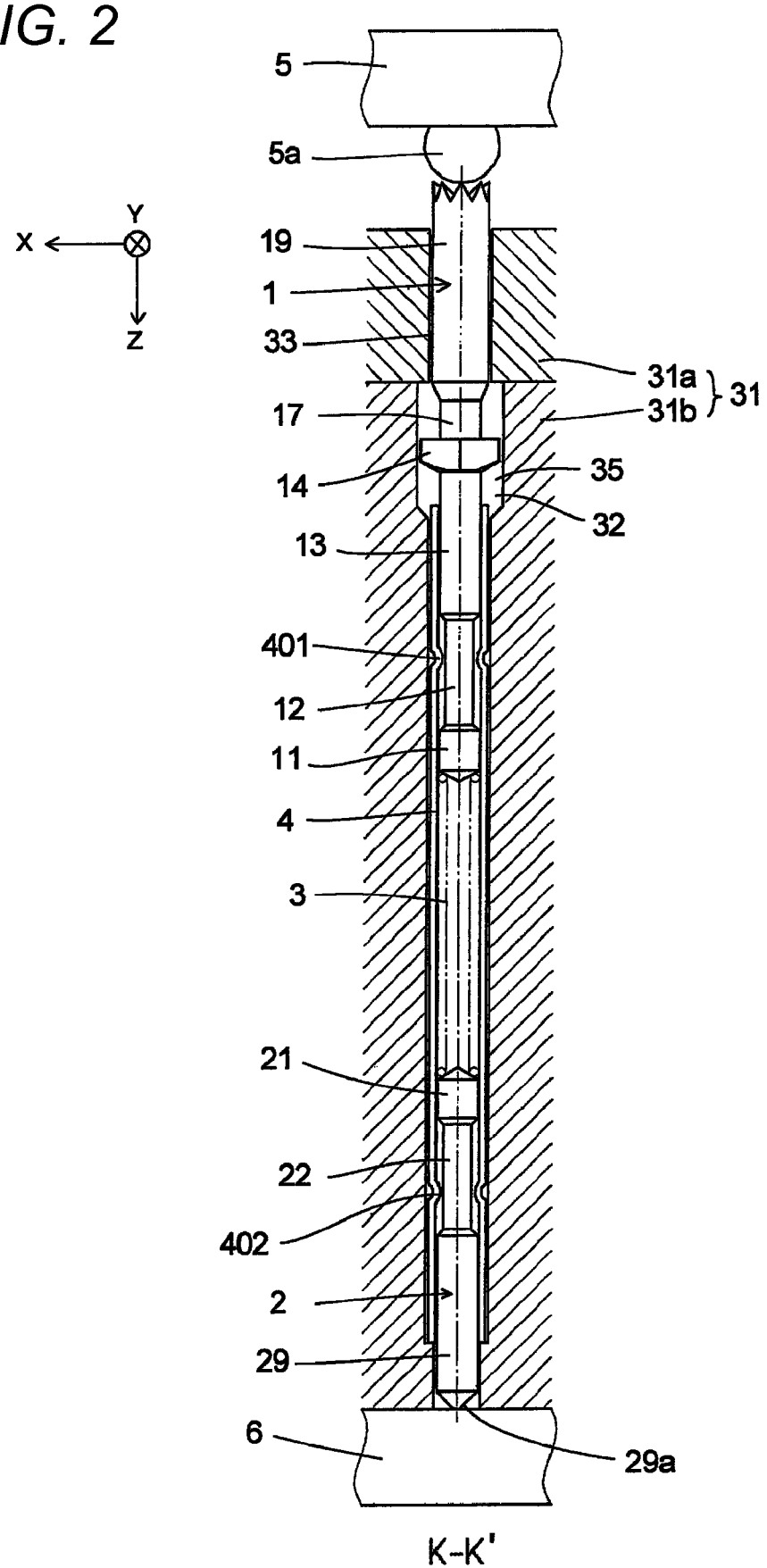
FIG. 2 is a sectional view taken along a line K-K' in FIG. 1(B).

Now, preferred embodiments of the invention will be described referring to the drawings. It is to be noted that the same or equivalent constituent elements, members, and so on which are shown in the respective drawings are denoted with the same reference numerals, and overlapped descriptions are omitted. It is also to be noted that the embodiments do not limit the invention, but only exemplifies the invention, and that all the features and combinations of the features described in the embodiments are not necessarily essential in the invention.

(First Embodiment)

Figure 3A:
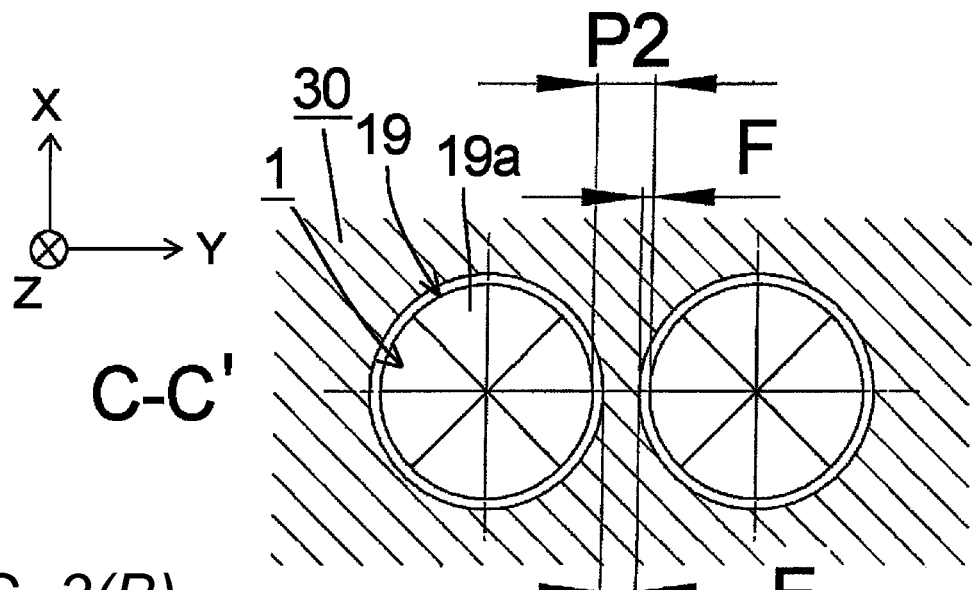
FIG. 3(A) is a view as seen from a direction of arrow marks C-C' in FIG. 1(B)
Figure 3B:
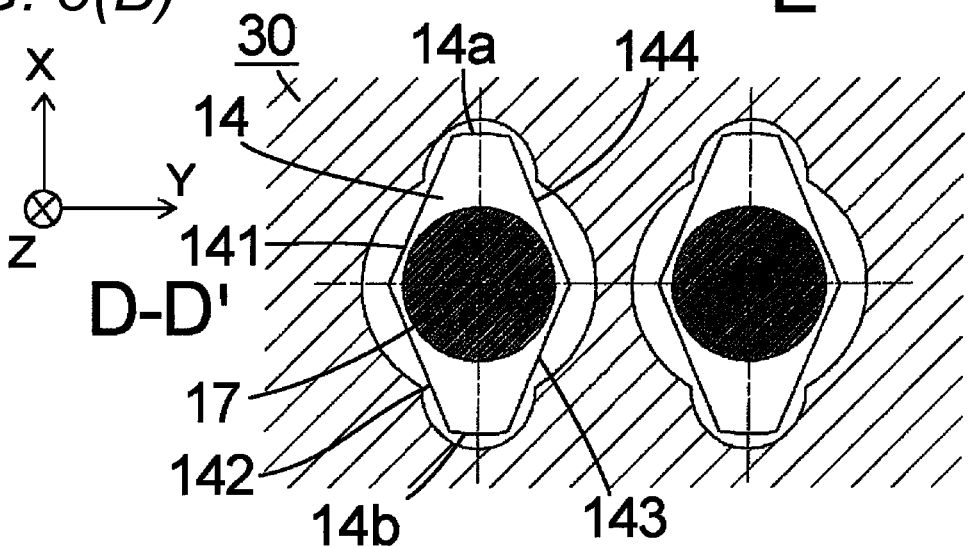
FIG. 3(B) is a sectional view taken along a line D-D' in FIG. 1(B)
Figure 3C:
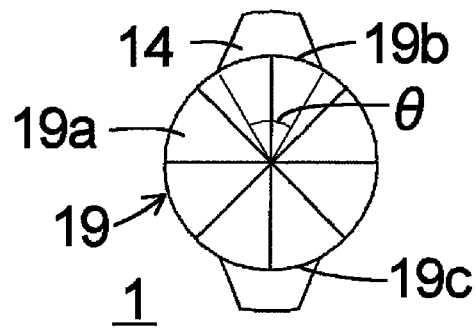
FIG. 3(C) is a view of a first plunger as seen from a distal end side.
Figure 4:
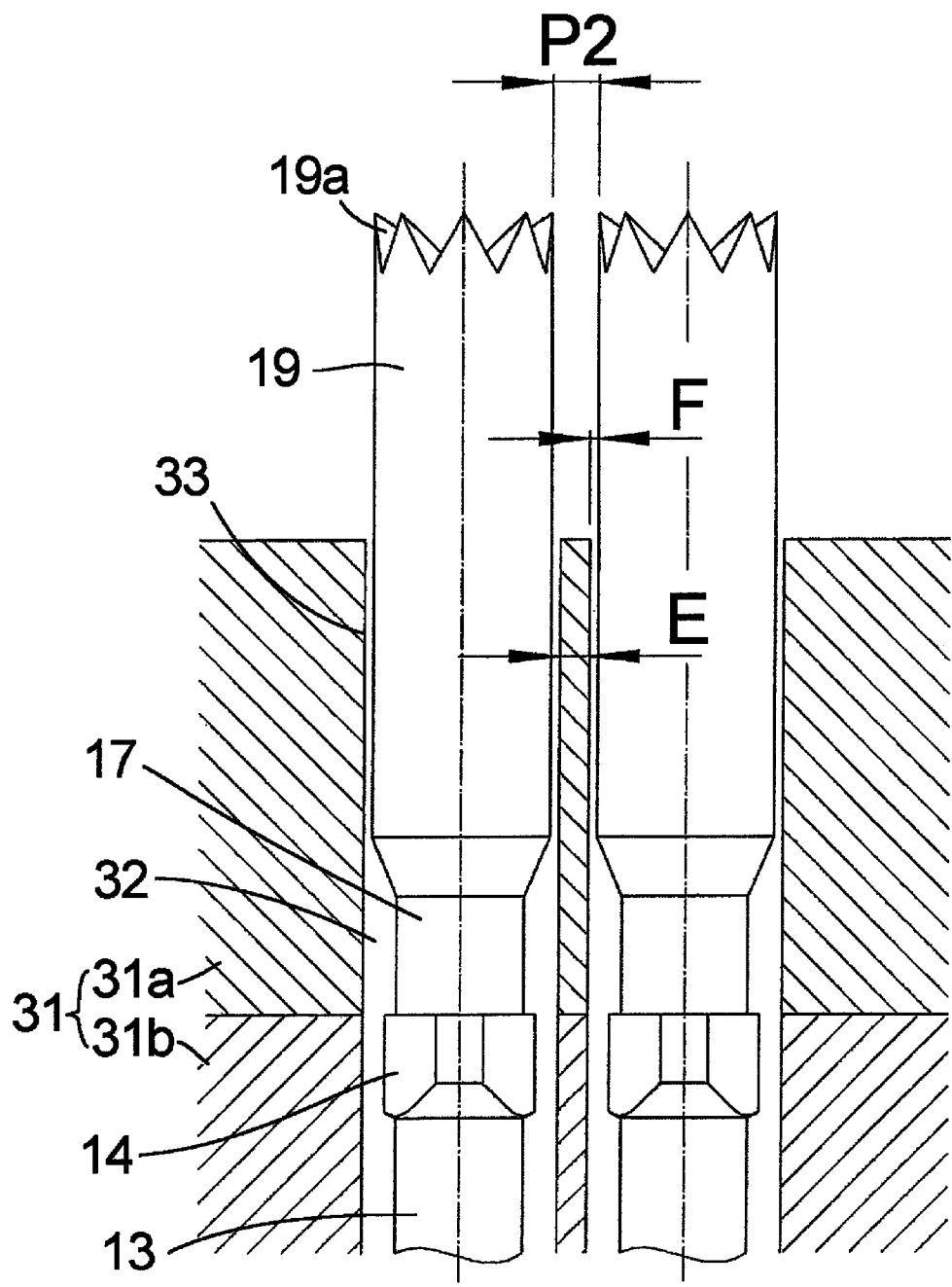
FIG. 4 is an enlarged sectional view of a part surrounding distal ends of the first plungers in FIG. 1.

FIG. 1(A) is a sectional front view of a socket 30 in which contact probes 100 according to a first embodiment of the invention are supported by an insulating support body 31, in a state of standby (in a state where springs are released), and FIG. 1(B) is a sectional front view of the same in a state where Kelvin measurement is carried out (in a state where the springs are contracted). FIG. 2 is a sectional view taken along a line K-K' in FIG. 1(B). In these drawings, first and second plungers 1, 2 of the respective contact probes 100 are not shown in section. FIG. 3(A) is a view as seen from a direction of arrow marks C-C' in FIG. 1(B), FIG. 3(B) is a sectional view taken along a line D-D' in FIG. 1(B), and FIG. 3(C) is a view of the first plunger 1 as seen from a distal end side. FIG. 4 is an enlarged sectional view of a part surrounding distal ends of the first plungers 1 in FIGS. 1(A) and 1(B).

The socket 30 in this embodiment is to be used for Kelvin measurement. One of the two contact probes 100 having the mutually same structure is used as a current supplying probe, and the other is used as a voltage monitoring probe. An axial direction of the contact probe 100 is defined as a direction of the Z-axis, a direction where a flange part 14, which will be described below, protrudes is defined as a direction of the X-axis, a direction perpendicular to both the directions of the Z-axis and X-axis is defined as a direction of the Y-axis. These three intersecting axes (the X-axis, Y-axis, and Z-axis) are defined, as shown in FIG. 1(A) and so on.

The contact probe 100 is coaxially provided with the first plunger 1, the second plunger 2, a coil spring 3 as the spring, and a tube 4. The first plunger 1 is a component to be connected to an object 5 to be inspected. The second plunger 2 is a component to be connected to an inspecting board 6. The tube 4 formed of conductive metallic substance such as copper or copper alloy slidably holds the first and second plungers 1, 2, and contains therein base end sides of the first and second plungers 1, 2 and the coil spring 3. The coil spring 3 formed of conductive metallic substance for general use, such as a piano wire or a stainless wire, is provided between the first and second plungers 1, 2 so as to urge the first and second plungers 1, 2 in a direction of separating them from each other, and thus, contact forces against the object 5 to be inspected and the inspecting board 6 are given to the first and second plungers 1, 2. The object 5 to be inspected is, for example, a semiconductor integrated circuit in which electrodes are arranged at a predetermined interval. In the embodiment as shown in the drawings, electrode bumps 5a are arranged at a predetermined interval. The inspecting board 6 has electrode pads (not shown) which are connected to a measuring instrument, at a predetermined interval corresponding to the electrode bumps 5a.

The first plunger 1 formed of conductive metallic substance such as copper or copper alloy has a base end side columnar part 11, a first small diameter part 12, a second small diameter part 13, a flange part 14, a third small diameter part 17, and a distal end side columnar part 19, in order from the base end side. The second plunger 2 similarly formed of conductive metallic substance such as copper or copper alloy has a base end side columnar part 21, a small diameter part 22, and a distal end side columnar part 29, in order from the base end side. The coil spring 3 is provided between respective end faces of the base end side columnar parts 11, 21 of the first and second plungers 1, 2 so as to apply urging forces in a direction separating the end faces from each other. The tube 4 in a cylindrical shape has neck parts 401, 402 which are recessed inward in a ring-like shape for retaining the first and second plungers 1, 2, at axially different two positions on a side face of an intermediate part thereof.

In the first plunger 1, the base end side columnar part 11 has a larger diameter than an inner diameter of the neck part 401. The first small diameter part 12 in a columnar shape has a smaller diameter than the inner diameter of the neck part 401. The neck part 401 is positioned in a range where the first small diameter part 12 exists, in the axial direction. Therefore, the base end side columnar part 11 is retained by the neck part 401 thereby preventing withdrawal of the first plunger 1 from the tube 4. The second small diameter part 13 in a columnar shape has a larger diameter than the inner diameter of the neck part 401, and a part of the second small diameter part 13 is always positioned inside the tube 4.

The flange part 14 has such a shape that a side face of a disc having a larger diameter than the distal end side columnar part 19 is cut into four planes so as to give a substantially rhombic shape, as seen from the axial direction (the Z direction), as shown in FIGS. 3(B), 3(C), and so on. In the embodiment as shown in the drawings, side face parts 14a, 14b corresponding to apexes at opposite sides in the X direction of the flange part 14 as seen from the axial direction are not cut, but remain arc-shaped. In other words, the flange part 14 has side faces 141 to 144 which are four flat planes, and a region enclosed by the side faces 141 to 144 (and the faces extended from these side faces on the same planes) is formed in a substantially rhombic shape, as seem from the axial direction. As shown in FIG. 1(A), the flange part 14 is smaller in width than the distal end side columnar part 19 as seen from the X direction, and positioned within a width where the distal end side columnar part 19 exists, which means that the flange part 14 does not extend outward (in a direction perpendicular to the axial direction) from a side face of the distal end side columnar part 19. On the other hand, when the flange part 14 is seen from the Y direction, as shown in FIG. 2, the flange part 14 has a larger width than the distal end side columnar part 19, and extends (protrudes) outward (in a direction perpendicular to the axial direction) from the side face of the distal end side columnar part 19. In short, as shown in FIG. 3(C), the flange part 14 extends outward from a region 19b and a region 19c of the side face of the distal end side columnar part 19 as seen from the axial direction, but does not extend outward from the other region except the regions 19b, 19c. Moreover, as shown in FIG. 3(C), respective ranges of the parts 19b, 19c out of the side face of the distal end side columnar part 19 where the flange part 14 extends outward, as seen from the axial direction, may preferably be within a center angle of 90 degrees, as seen from the axial direction. Further, the flange part 14 may preferably extend so as to become smaller in width, as it goes in the X direction from a center axis (extends in a taper shape).

A base end of the third small diameter part 17 in a columnar shape is continued to a distal end face of the flange part 14. The distal end side columnar part 19 is larger in diameter than the base end side columnar part 11, the second small diameter part 13 and the third small diameter part 17, and also larger in diameter than the base end side columnar part 21 and the distal end side columnar part 29 of the second plunger 2. Moreover, the distal end side columnar part 19 has the same diameter as the tube 4. The distal end of the distal end side columnar part 19 is formed as a contact part 19a to be contacted with the electrode bump 5a of the object 5 to be inspected. The contact part 19a is split into angled shapes (herein, split in eight), and there are eight apexes of the angled shapes along an outer circumference, at an equal angle (herein, 45 degrees) from the center. It is to be noted that in FIG. 3(A), only ridge lines of the angled shapes (ridge lines of convex parts) are shown, but root lines are not shown.

In the second plunger 2, the base end side columnar part 21 has a larger diameter than an inner diameter of the neck part 402. The small diameter part 22 in a columnar shape has a smaller diameter than the inner diameter of the neck part 402. The neck part 402 is positioned within a range where the small diameter part 22 exists, in the axial direction. Therefore, the base end side columnar part 21 is retained by the neck part 402 thereby to prevent withdrawal of the second plunger 2 from the tube 4. The distal end side columnar part 29 has a larger diameter than the inner diameter of the neck part 402, and a base end side of the distal end side columnar part 29 is partially positioned inside the tube 4. A distal end side of the distal end side columnar part 29 is formed as a contact part 29a to be contacted with an electrode pad (not shown) of the inspecting board 6. The contact part 29a has a conical shape, for example.

The socket 30 includes an insulating support body 31 which has hollow parts 32 for disposing therein a plurality of contact probes 100 in parallel with each other, at a predetermined interval. The contact probes 100 are inserted and disposed respectively in the hollow parts 32. Specifically, each of the contact probes 100 constructed by integrally assembling the first plunger 1, the second plunger 2, the coil spring 3 and the tube 4 is inserted into the hollow part 32 in the insulating support body 31. The insulating support body 31 is divided into a first layer 31a and a second layer 31b so that the contact probe 100 can be incorporated in the hollow part 32.

Opening side sliding support parts 33, 34 which are formed in both end parts (upper and lower end parts) of the hollow part 32 slidably support (are engaged with) the distal end side columnar parts 19, 29 of the first and second plungers 1, 2 respectively. An intermediate part 35 of the hollow part 32 except the opening side sliding support parts 33, 34 has the same diameter (or may be smaller than the same diameter) as the opening side sliding support part 33, except a boundary part between the first layer 31a and the second layer 31b. However, the second layer 31b at a side where the first layer 31a is bonded thereto (at a side adjacent to the opening side sliding support part 33) is enlarged in the X direction as shown in FIG. 2, and has a larger diameter than the opening side sliding support part 33. The opening side sliding support part 33 is engaged with the flange part 14 thereby to restrain withdrawal of the contact probe 100. The opening side sliding support part 34 has a smaller diameter than the tube 4, and is engaged with one end of the tube 4 thereby to restrain withdrawal of the contact probe 100.

In the socket 30, the adjacent contact probes 100 are opposed to each other between the regions of the side faces of the respective distal end side columnar parts 19 where the flange parts 14 do not extend outward as seen from the axial direction (the regions except those regions as shown by the reference numerals 19b, 19c, in FIG. 3(C)). In this embodiment, a contact pitch P2 between the adjacent contact probes 100 is represented by the following equation (See FIG. 3(A) and FIG. 4).

$$P2 = E + (F \times 2) \quad \text{Equation 2}$$

E: the smallest wall thickness of the insulating support body 31

F: a gap between the insulating support body 31 and the side face of the distal end side columnar part 19

The contact pitch P2 in this embodiment which is represented by the equation 2 is smaller than the related-art contact pitch P1 which is represented by the equation 1, by $\Delta P = (G \times 2) + (H \times 2)$. This is because, as a first reason, the adjacent contact probes 100 are opposed to each other between the regions of the side faces of the respective distal end side columnar parts 19 where the flange parts 14 do not extend outward as seen from the axial direction, in this embodiment, and a portion corresponding to G (a difference in radius between the flange part and the distal end side columnar part) in the equation 1 in the related-art contact pitch P1 can be made zero. This is further because, as a second reason, the flange part 14 serves as a rotation detent of the first plunger 1, and the contact parts 19a of the respective distal end side columnar parts 19 of the adjacent contact probes 100 can be held at such an angle that the apexes of the angled shapes may be opposed at a smallest distance, and hence, a portion corresponding to H (a distance from the side face of the distal end side columnar part 19 to the apex of the angled shape of the distal end face) can be made substantially zero.

Figure 5A:
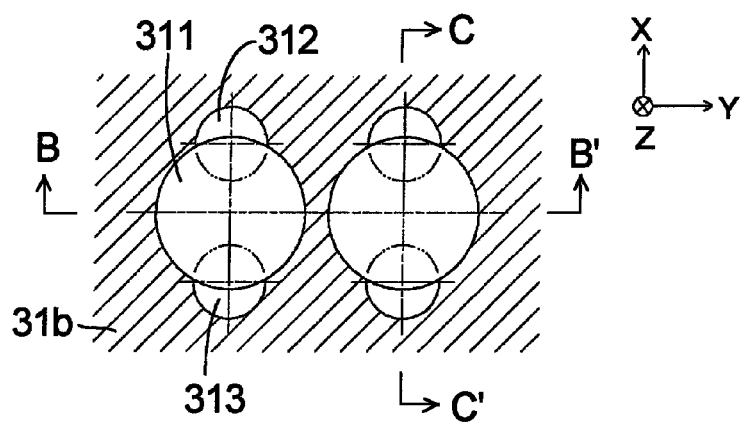
FIG. 5(A) is a view of a second layer of the insulating support body as shown in FIGS. 1(A) and 1(B), as seen from an axial direction.
Figure 5B:
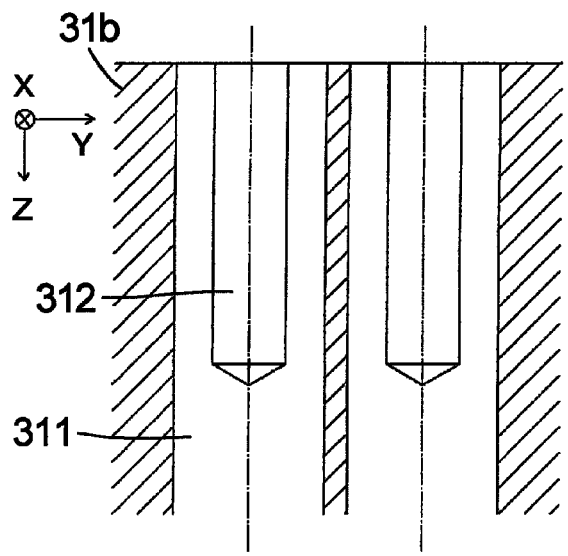
FIG. 5(B) is a sectional view taken along a line B-B' in FIG. 5(A)
Figure 5C:
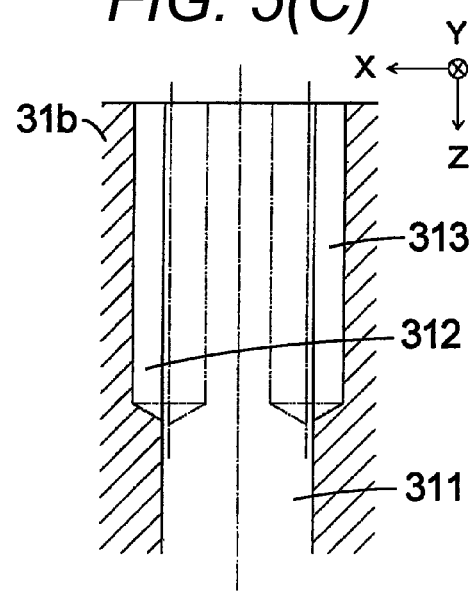
FIG. 5(C) is a sectional view taken along a line C-C' in FIG. 5(A).

FIG. 5(A) is a view of the second layer 31b of the insulating support body 31 as shown in FIGS. 1(A) and 1(B), as seen from the axial direction, FIG. 5(B) is a sectional view taken along a line B-B' in FIG. 5(A), and FIG. 5(C) is a sectional view taken along a line C-C' in FIG. 5(A). The base end sides of the first and second plungers 1, 2, the coil springs 3, and the tubes 4 as shown in FIGS. 1(A) and 1(B) are respectively contained in main holes 311. Flange receiving hole parts 312, 313 which are continued from the main holes 311 at both sides of the main holes 311 in the X direction and have a predetermined depth are smaller in diameter than the main holes 311, and secure spaces in which the portions of the flange parts 14 extended outward from the side faces of the distal end side columnar parts 19, as seen from the axial direction, can move in the Z direction. As working steps, after the flange receiving hole parts 312, 313 are worked as a first step, the main holes 311 are worked. A general-purpose drill may be used for working the holes and the hole parts.

Figure 6:
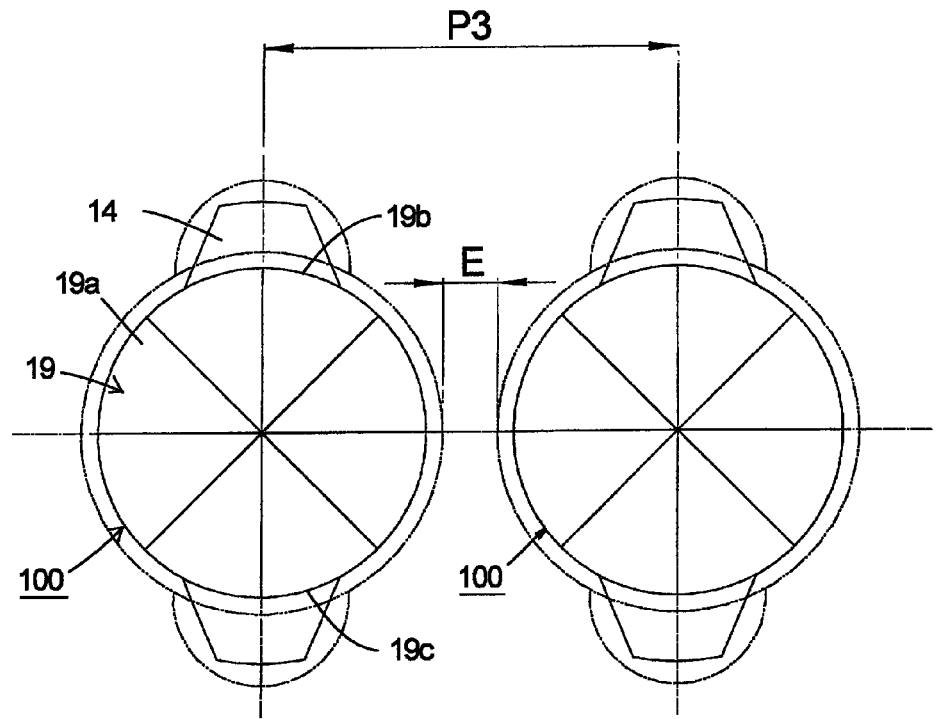
FIG. 6 is an explanatory view showing an example 1 in which the two adjacent contact probes are arranged, as seen from the Z direction.
Figure 7:
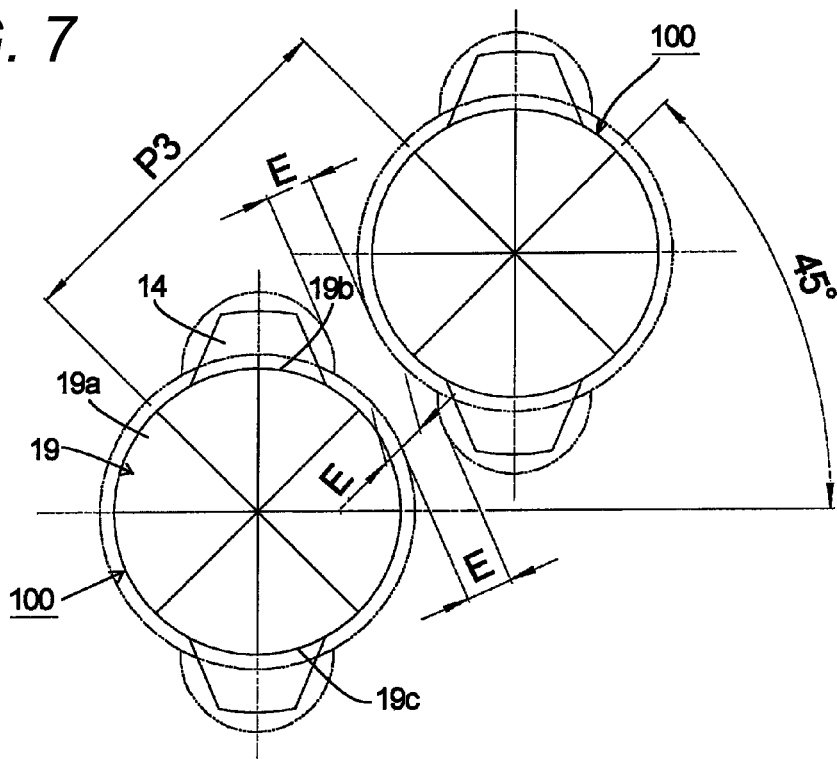
FIG. 7 is an explanatory view showing an example 2 in which the two adjacent contact probes are arranged, as seen from the Z direction.
Figure 8:
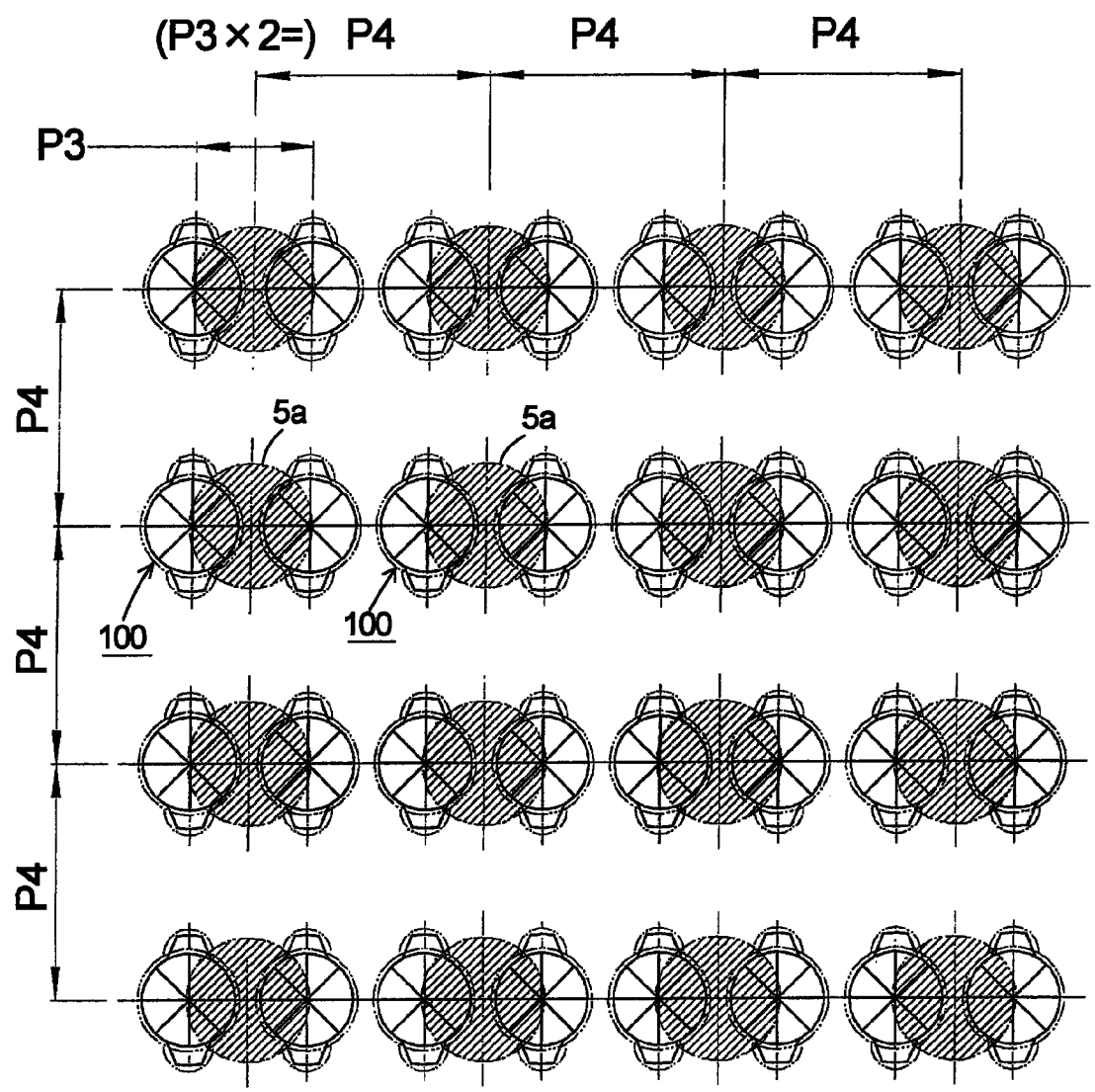
FIG. 8 is an explanatory view showing an example 1 in which arrays of a number of the contact probes based on the arranging example 1 as shown in FIG. 6 are arranged, as seen from the Z direction.
Figure 9:
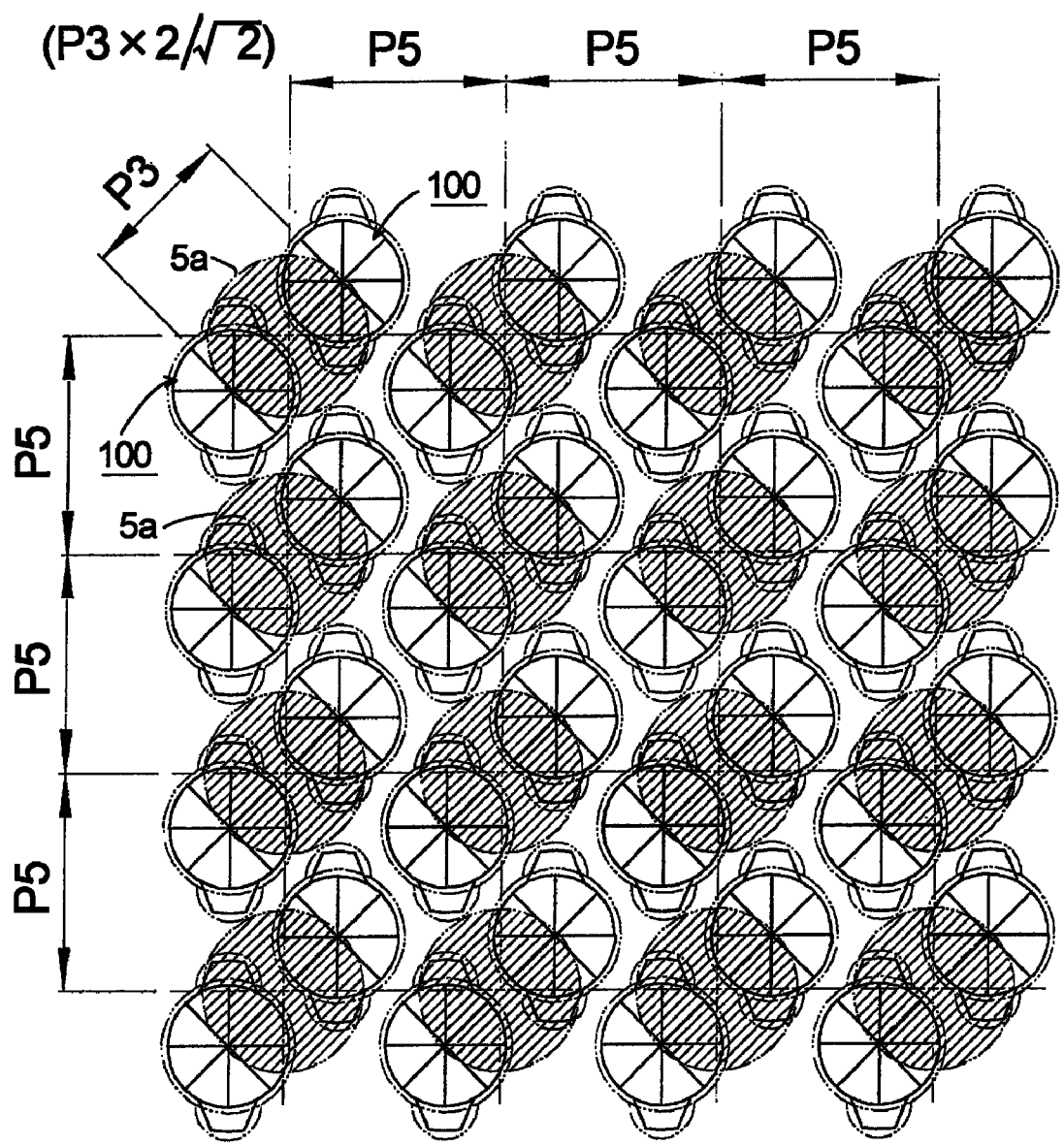
FIG. 9 is an explanatory view showing an example 2 in which arrays of a number of the contact probes based on the arranging example 2 as shown in FIG. 7 are arranged, as seen from the Z direction.

FIG. 6 is an explanatory view showing an example 1 in which the adjacent contact probes 100 (the nearest two contact probes 100) are arranged, as seen from the Z direction. FIG. 7 is an explanatory view showing an example 2 in which the adjacent contact probes 100 (the nearest two contact probes 100) are arranged, as seen from the Z direction. FIG. 8 is an explanatory view showing an example 1 in which arrays of a number of the contact probes 100 based on the arranging example 1 as shown in FIG. 6 are arranged, as seen from the Z direction. FIG. 9 is an explanatory view showing an example 2 in which arrays of a number of the contact probes 100 based on the arranging example 2 as shown in FIG. 7 are arranged, as seen from the Z direction. It is to be noted that arrays of the electrode bumps 5a which are the object to be contacted are shown by two dot chain lines.

The arranging example 1 as shown in FIG. 6 is the same as the arrangement as shown in FIGS. 1(A) and 1(B), and in this example, the contact probes 100 having the flange parts 14 which are protruded in the X direction are arranged in the Y direction. The arranging example 2 as shown in FIG. 7 is the example in which the contact probes 100 having the flange parts 14 which are protruded in the X direction are arranged at 45 degrees with respect to the X direction (also at 45 degrees with respect to the Y direction). A pitch P3 for arranging the contact probes 100 is the same in both the arranging examples 1 and 2. On the other hand, the smallest arranging pitch of the electrode bumps 5a is different from each other in the arranging example 1 and the arranging example 2.

As shown in FIG. 8, in case of arranging the arrays of the contact probes 100 based on the arranging example 1, the smallest arranging pitch P4 of the electrode bumps 5a is represented by $P4 = P3 \times 2$. On the other hand, in case of arranging the arrays of the contact probes 100 based on the arranging example 2, the smallest arranging pitch P5 of the electrode bumps 5a is represented by $P5 = P3 \times 2/\sqrt{2}$, and can be made about 30% smaller than the smallest arranging pitch P4 based on the arranging example 1. From a different standpoint, the arranging example 2 is more favorable, because it is possible to arrange the first plunger 1 having a larger diameter than in case of the arranging example 1, provided that the arranging pitch P5 of the electrode bumps 5a is the same in both cases. Moreover, for realizing the smaller pitch, it is desirable that the flange part 14 becomes smaller in width as seen from the axial direction, as it goes in the X direction from the center axis.

In order to carry out the inspection using the socket 30, the socket 30 is positioned to be placed on the inspecting board 6. Consequently, the coil spring 3 is contracted by a predetermined length, and the contact part 29a of the distal end side columnar part 29 of the second plunger 2 is elastically contacted with the electrode pad on the inspecting board 6. In a state where the object 5 to be inspected such as a semiconductor integrated circuit is not present, the first plunger 1 is moved in a projecting direction, until the flange part 14 is restrained by the opening side sliding support part 33, and a projecting amount of the distal end side columnar part 19 is the largest. When the object 5 to be inspected is disposed so as to be opposed to the insulating support body 31 of the socket 30 at a predetermined distance, the distal end side columnar part 19 is retracted, and the coil spring 3 is further contracted. As the results, the distal end side columnar part 19 is brought into elastic contact with the electrode bump 5a of the object 5 to be inspected. In this state, the inspection of the object 5 to be inspected is carried out.

According to the embodiment, the following advantages can be obtained.

(1) Because the adjacent contact probes 100 are opposed to each other between the regions of the side faces of the respective distal end side columnar parts 19 where the flange parts 14 do not extend outward as seen from the axial direction, it is possible to make the contact pitch smaller than in the related-art case.

(2) Because the flange part 14 serves as the rotation detent of the first plunger 1, the contact parts 19a of the respective distal end side columnar parts 19 of the adjacent contact probes 100 can be held at such an angle that a distance between the apexes of the angled shapes of the contact parts 19a is the smallest. This is also advantageous in making the contact pitch smaller as compared with the related-art case.

(3) As already described referring to FIGS. 5(A) to 5(C), the holes in the second layer 31b of the insulating support body 31 can be worked by using an ordinary drill (general-purpose drill). Therefore, particular hole working (hole working using an end mill or the like) is not required, and the production can be easily conducted at a low cost.

(4) The flange part 14 is formed in the third small diameter part 17 having the smaller diameter than the distal end side columnar part 19. Specifically, because the distal end face of the flange part 14 is in contact with the base end of the third small diameter part 17, it is possible to prevent burrs which occur, when the flange part 14 is worked, from protruding outward from the distal end side columnar part 19. More specifically, because a gap between the insulating support body 31 and the side face of the distal end side columnar part 19 is so designed as to be as small as possible, it is required to prevent occurrence of the burrs protruding outward from the distal end side columnar part 19. However, in this embodiment, the flange part 14 protrudes from the third small diameter part 17 having the smaller diameter than the distal end side columnar part 19, and therefore, occurrence of such burrs can be favorably prevented.

(Second Embodiment)

Figure 11:
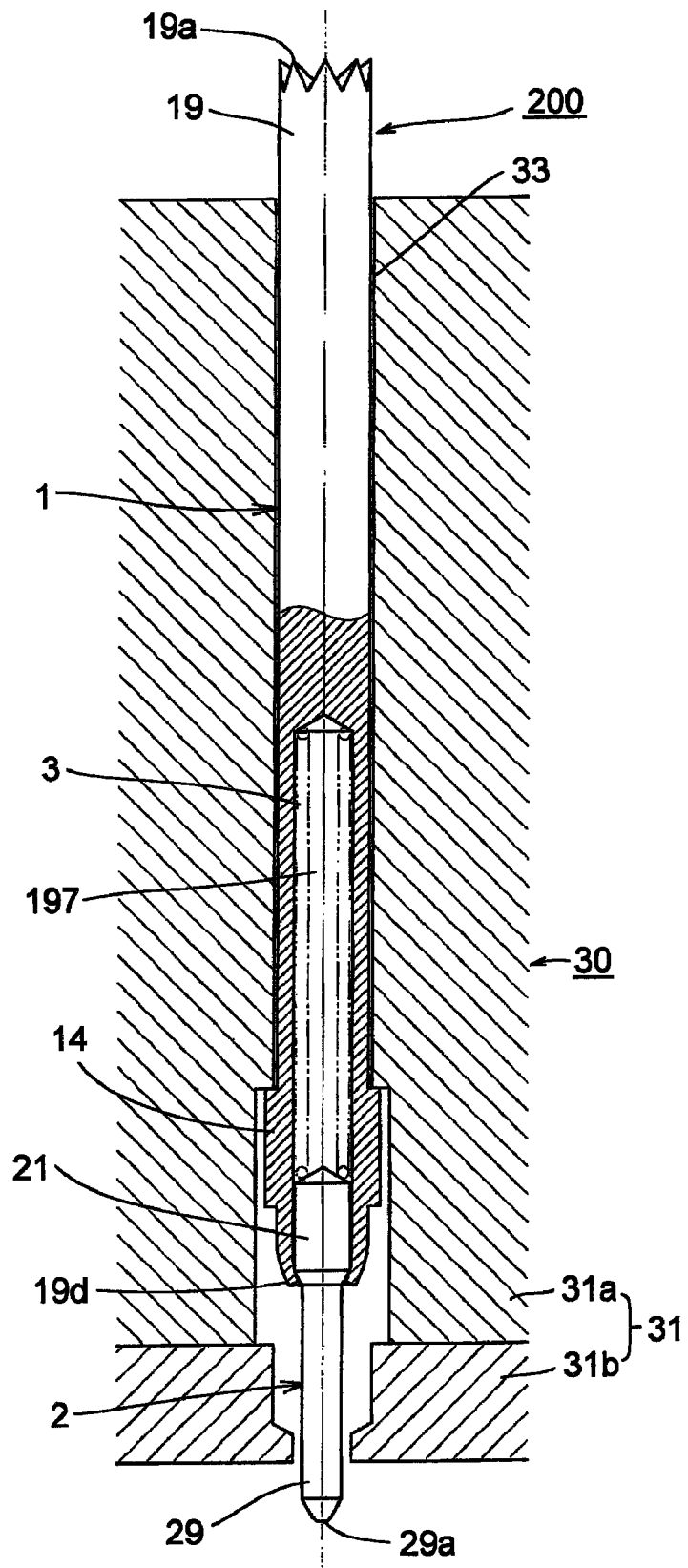
FIG. 11 is a sectional view of a socket in which the contact probe is supported by an insulating support body.

FIG. 10(A) is a front view for explaining a shape of a contact probe 200 according to a second embodiment of the invention, a part of which is shown in section, FIG. 10(B) is a right side view of the contact probe 200, FIG. 10(C) is a bottom view of the contact probe 200, and FIG. 10(D) is a sectional view taken along a line X-X' in FIG. 10(A). FIG. 11 is a sectional view of the socket 30 in which the contact probe is supported by the insulating support body 31. The second embodiment will be described below, mainly referring to differences from the first embodiment.

The first plunger 1 is provided with the flange part 14 at the base end side of the distal end side columnar part 19. A hole part 197 is formed by a predetermined depth from a base end face of the distal end side columnar part 19. The coil spring 3 and the base end side columnar part 21 of the second plunger 2 are positioned inside the hole part 197. An opening side of the hole part 197 is made smaller in diameter, by caulking work, for example. Specifically, the base end of the distal end side columnar part 19 is caulked to form a caulked part 19d thereby to prevent withdrawal of the base end side columnar part 21. The coil spring 3 is provided between an end face of the base end side columnar part 21 and a bottom face of the hole part 197, thereby to apply urging forces in a direction of separating the respective faces from each other. The contact probe 200 is composed of the first plunger 1, the second plunger 2, and the coil spring 3. Moreover, in this embodiment, a moving space of the flange part 14 is formed by drilling in the first layer 31a of the insulating support body 31. A method of drilling is substantially the same as described referring to FIGS. 5(A) to 5(C). A plurality of the contact probes 200 may be arranged in the same manner as in the first embodiment.

In this embodiment too, it is possible to realize the smaller contact pitch substantially in the same manner as in the first embodiment. Moreover, because the tube 4 is not required, the number of components can be reduced as compared with the first embodiment. Further, by making the distal end side columnar part 19 smaller in diameter within a range of a predetermined length from a contact point with respect to the distal end face of the flange part 14, it is possible to prevent occurrence of the burrs protruding outward from the distal end side columnar part 19 in the same manner as in the first embodiment.

(Third Embodiment)

Figure 12A:
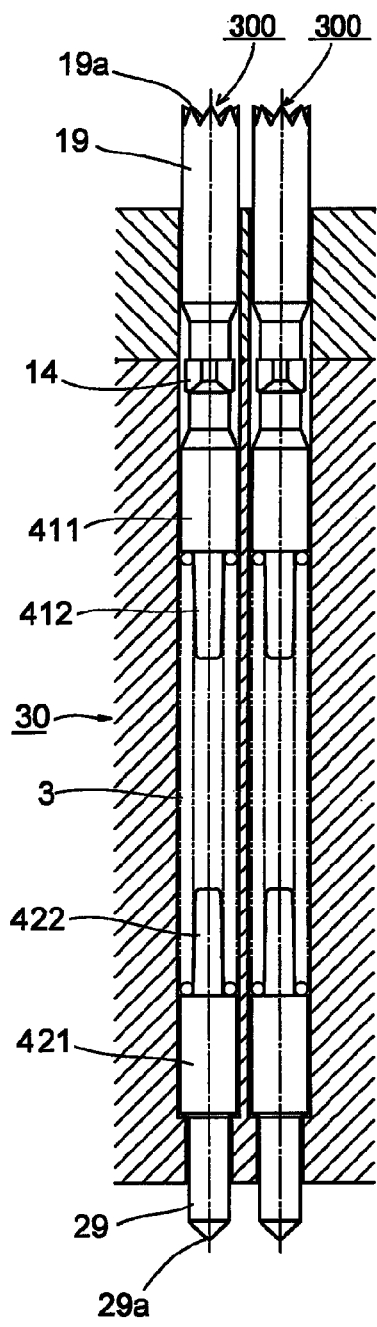
FIG. 12(A) is an explanatory view of a socket in which contact probes according to a third embodiment of the invention are supported by an insulating support body, in a state of standby (in a state where springs are released)
Figure 12B:
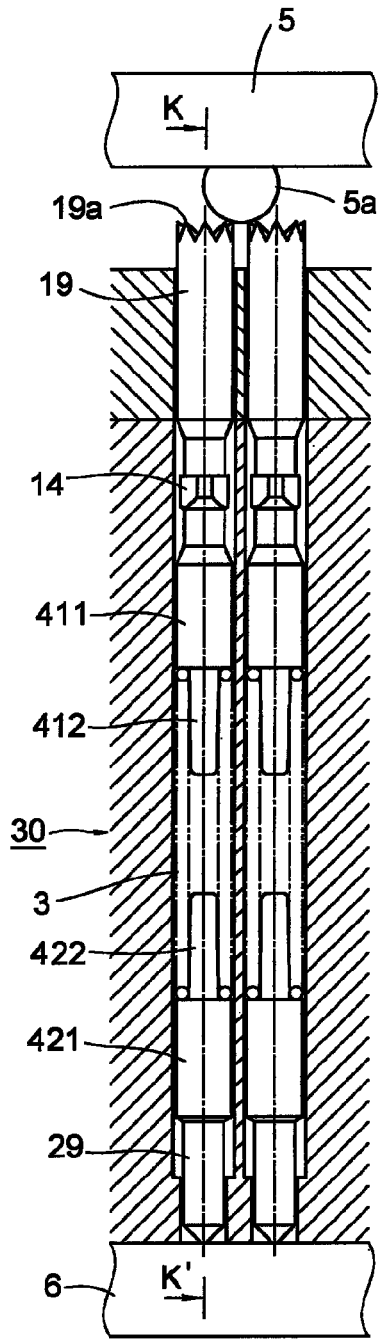
FIG. 12(B) is an explanatory view of the same in a state where Kelvin measurement is carried out (in a state where the springs are contracted)
Figure 12C:
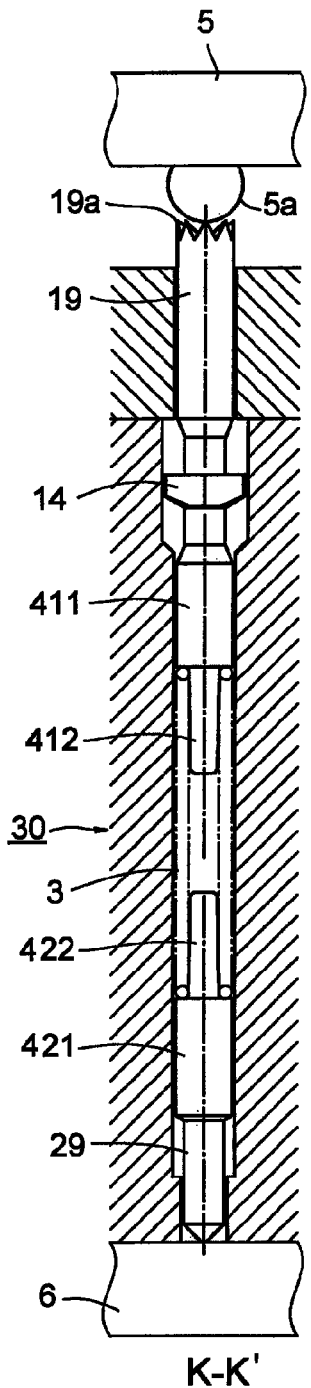
FIG. 12(C) is a sectional view taken along a line K-K' in FIG. 12(B).

FIG. 12(A) is an explanatory view of a socket in which contact probes 300 (of a tubeless type) according to a third embodiment of the invention are supported by the insulating support body 31, in a state of standby (in a state where the springs are released), FIG. 12(B) is an explanatory view of the same in a state where Kelvin measurement is carried out (in a state where the springs are contracted), and FIG. 12(C) is a sectional view taken along a line K-K' in FIG. 12(B). The first plunger 1 of the contact probe 300 is so constructed that the base end side columnar part 11, the first small diameter part 12, and the second small diameter part 13 in the first embodiment, as shown in FIGS. 1(A) and 1(B) and so on, are substituted with a base end side columnar part 411 having substantially the same diameter as the tube 4, and a rod-like part 412 having a smaller diameter than the base end side columnar part 411 is projected in the axial direction from a center of a base end face of the base end side columnar part 411. The coil spring 3 is butted against an edge of the base end face of the base end side columnar part 411. The rod-like part 412 extends inside the coil spring 3. The second plunger 2 of the contact probe 300 is so constructed that the base end side columnar part 21 and the small diameter part 22 in the first embodiment are substituted with a base end side columnar part 421 having substantially the same diameter as the tube 4, and a rod-like part 422 having a smaller diameter than the base end side columnar part 421 is projected in the axial direction from a center of a base end face of the base end side columnar part 421. The coil spring 3 is butted against an edge of the base end face of the base end side columnar part 421. The rod-like part 422 extends inside the coil spring 3. The coil spring 3 has a smaller diameter than the distal end side columnar part 19, and applies urging forces in a direction of separating the base end faces of the respective base end side columnar parts 411, 421 from each other. The contact probe 300 is composed of the first plunger 1, the second plunger 2, and the coil spring 3. A plurality of the contact probes 300 may be arranged in the same manner as in the first embodiment.

(Fourth Embodiment)

Figure 13:
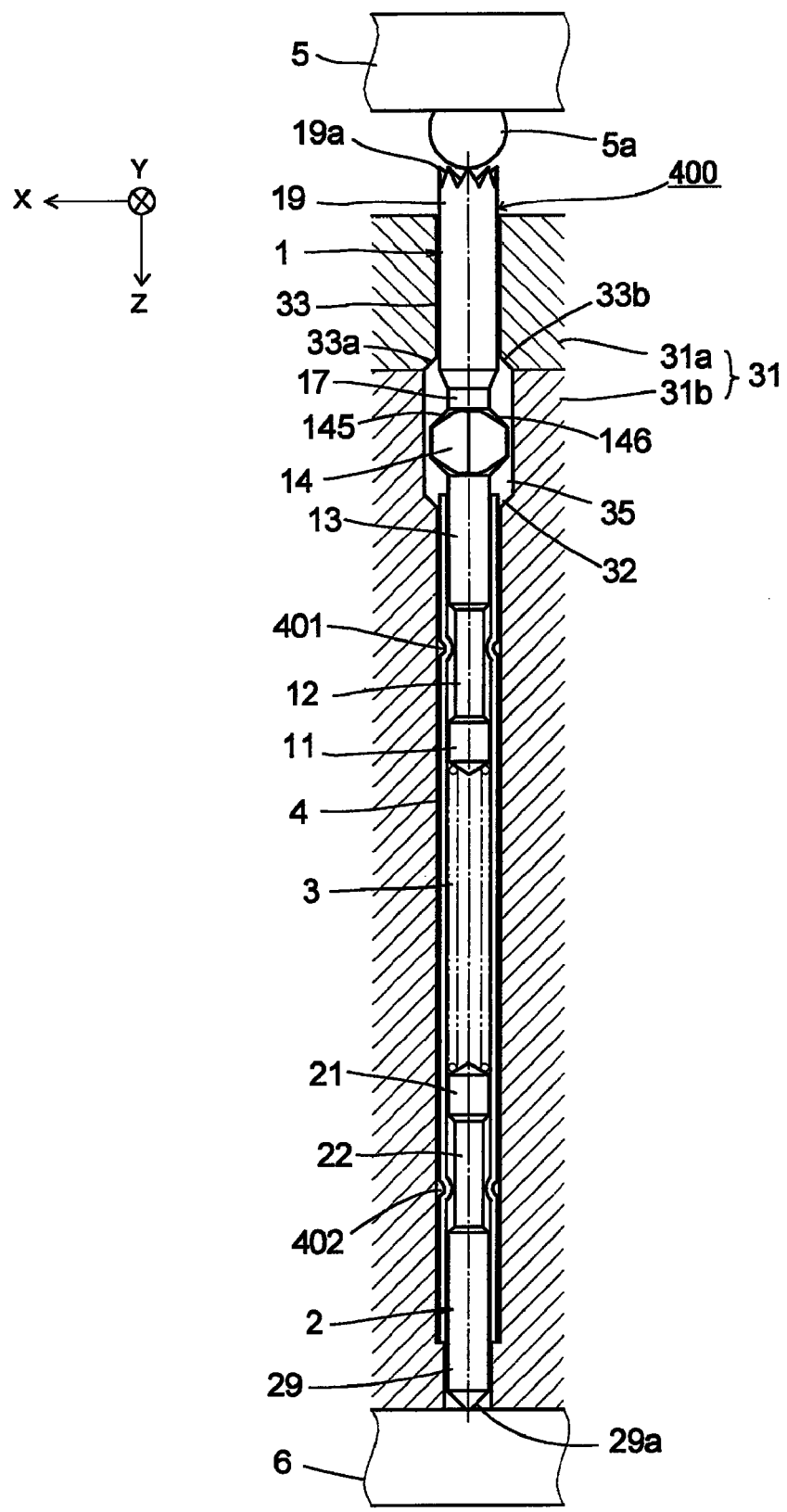
FIG. 13 is a sectional view of a socket in which a contact probe according to a fourth embodiment of the invention is supported by an insulating support body, as seen from the Y direction.
Figure 14:
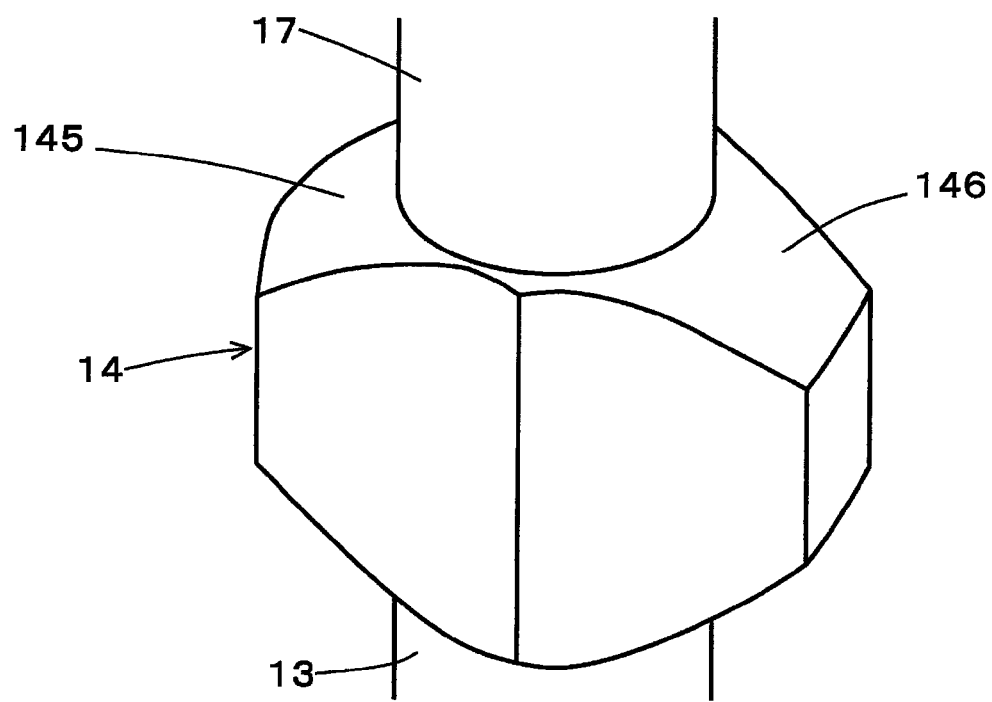
FIG. 14 is an enlarged perspective view of a flange part of the contact probe in FIG. 13.

FIG. 13 is a sectional view of a socket in which a contact probe 400 according to a fourth embodiment of the invention is supported by the insulating support body 31, as seen from the Y direction. In this drawing, the first and second plungers 1, 2 of the contact probe 400 are not shown in section. FIG. 14 is an enlarged perspective view of the flange part 14 of the contact probe 400. The fourth embodiment will be described below, mainly referring to differences from the first embodiment.

In this embodiment, upper faces 145, 146 of the flange part 14 are tapered at 45 degrees, for example, with respect to the Z direction. Moreover, engaging faces 33a, 33b of the opening side sliding support part 33 to be engaged with the upper faces 145, 146 of the flange part 14 are chamfered (at 45 degrees, for example) so as to be in parallel with the upper faces 145, 146 of the flange part 14. According to this embodiment, in addition to the advantages in the first embodiment, a corner part at the distal end of the distal end side columnar part 19 of the first plunger 1 is unlikely to be caught, when the insulating support body 31 is assembled, and hence, assembling workability is enhanced. Moreover, contact area between the upper faces 145, 146 of the flange part 14 and the engaging faces 33a, 33b of the opening side sliding support part 33 can be made larger as compared with a case where they are perpendicular to the Z direction. As the results, pressure on the contact faces can be reduced, thereby preventing damages on the contact faces.

Although the invention has been described hereinabove, referring to the embodiments by way of examples, it is to be understood by those skilled in the art that various modifications can be made in the respective constituent elements and treating processes in the embodiments within a scope as described in the claims. The modifications will be described below.

Figures 15A, 15B, 15C:
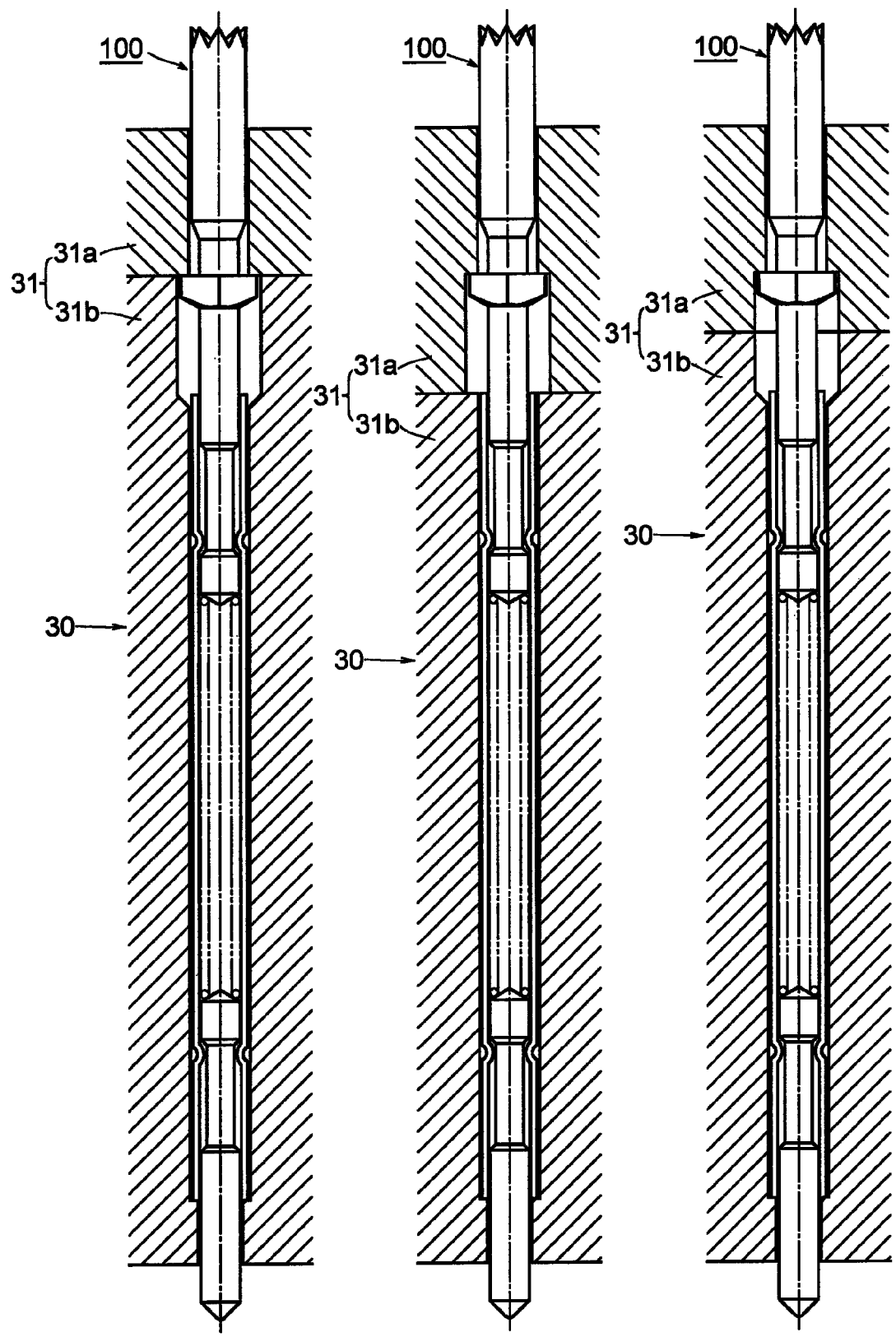
FIG. 15 is views for explaining variations of a position where the insulating support body in the first embodiment is divided into a first layer and a second layer.

FIGS. 15(A) to 15(C) are views for explaining variations of the position where the insulating support body 31 in the first embodiment is divided into the first layer 31a and the second layer 31b. In FIG. 15(A), the position is substantially the same as in the first embodiment. In FIG. 15(B), the moving space of the flange part 14 is formed in the first layer 31a, and in FIG. 15(C), the moving space of the flange part 14 is formed across the first layer 31a and the second layer 31b.

Figures 16A, 16B, 16C:
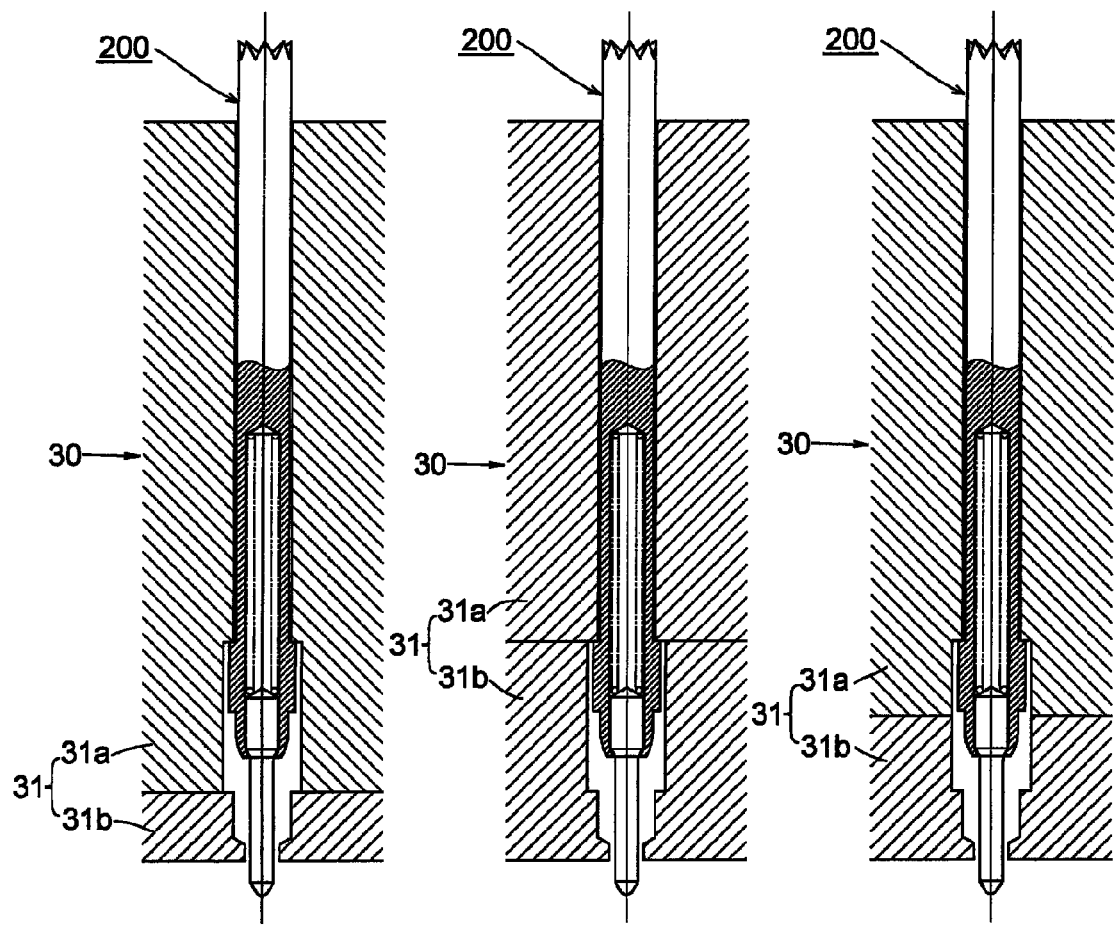
FIG. 16 is views for explaining variations of a position where the insulating support body in the second embodiment is divided into a first layer and a second layer.
Figure 18A:
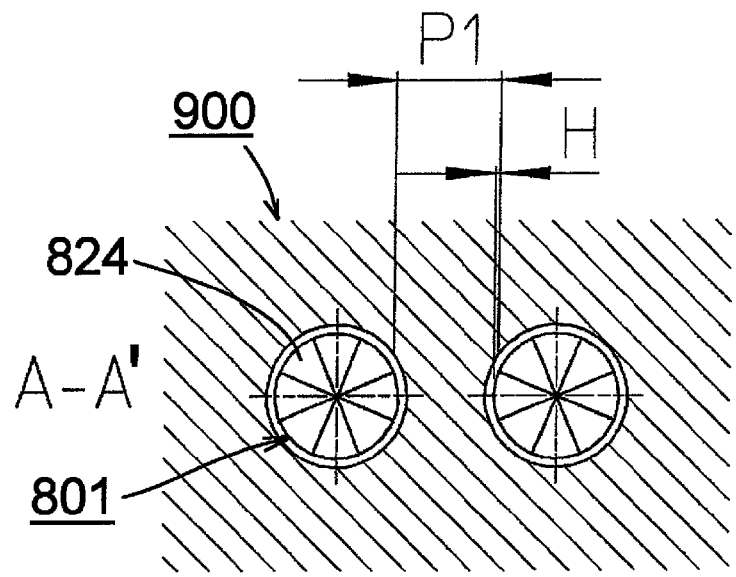
FIG. 18(A) is a view as seen from a direction of arrow marks A-A' in FIG. 17(B)
Figure 18B:
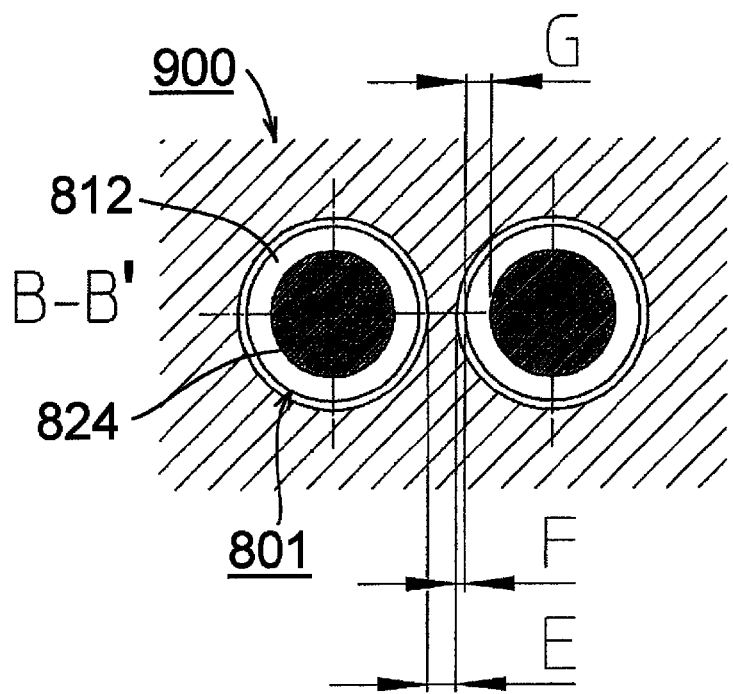
FIG. 18(B) is a sectional view taken along a line B-B' in FIG. 17(B).
Figure 19:
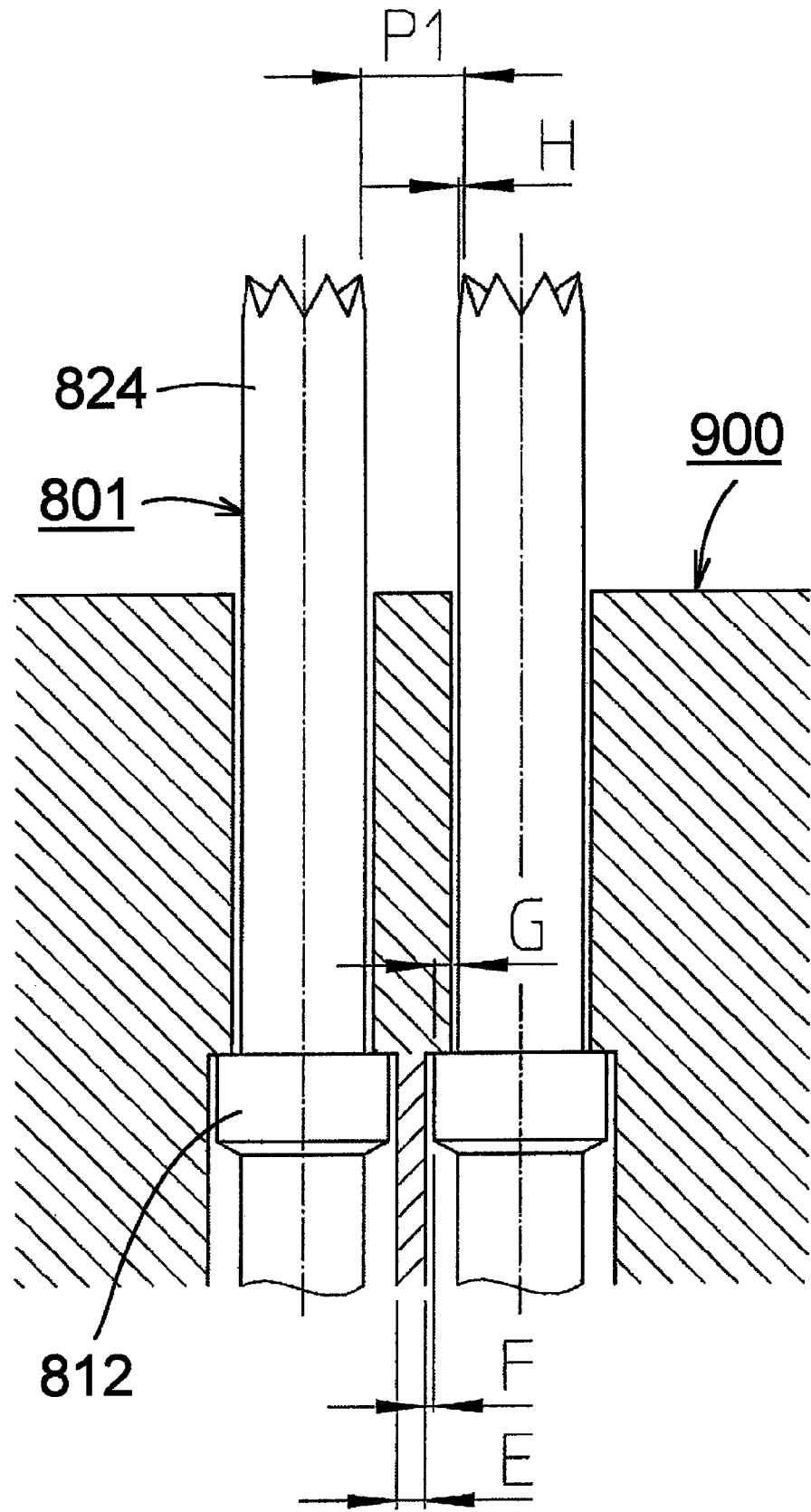
FIG. 19 is an enlarged sectional view of a part surrounding distal end parts of first plungers in FIGS. 17(A) and 17(B).

FIGS. 16(A) to (C) are views for explaining variations of the position where the insulating support body 31 in the second embodiment is divided into the first layer 31a and the second layer 32b. In FIG. 16(A), the position is substantially the same as in the second embodiment. In FIG. 16(B), the moving space of the flange part 14 is formed in the second layer 31b, and in FIG. 16(C), the moving space of the flange part 14 is formed across the first layer 31a and the second layer 31b.

The base end side columnar parts 11, 21 in the embodiments need not necessarily have a columnar shape, but may have a spherical shape or an elliptic spherical shape.

The flange part 14 may have a rectangular shape, as seen from the axial direction. Moreover, the flange part 14 may be so shaped as to extend outward only from one region of the side face of the distal end side columnar part 19, as seen from the axial direction. It would be preferable in view of balance that the flange part 14 extends outward from the two regions, as in the embodiments. However, in case where the flange part 14 extends outward only from the one region, it is also possible to realize functions for preventing withdrawal and as the rotation detent. Moreover, incase of making the contact pitch between the particular two contact probes smaller, the flange part 14 may be cut into two planes. Specifically, the side faces 141, 142 (the side faces which are not opposed to the other contact probe) in FIG. 3(B) may remain arc-shaped, without being worked.

The end face of the distal end side columnar part 19 need not necessarily be split into the angled shapes, but may have a flat face perpendicular to the axial direction, or may have such a distal end shape as a plunger 24, which is shown in FIG. 2 of JP-A-2008-45986.

A pair of the contact probes for Kelvin measurement need not necessarily have the same shape. For example, the current supplying contact probe may be formed larger in diameter than the voltage monitoring probe.

The contact probe and socket are not used for Kelvin measurement only, but may be also used in case where the electrode bumps 5a of the same number as the contact probes exist.

According to as aspect of the invention, the flange part extends outward from one region of the side face of the distal end side columnar part, as seen from an axial direction, but does not extend from the other region of the side face except the one region. Therefore, it is possible to make the contact pitch smaller as compared with the related-art case, by disposing the two contact probes so that the regions of the side faces of the distal end side columnar parts where the flange parts do not extend outward, as seen from the axial direction, may be opposed to each other.

What is claimed is:

1. A contact probe comprising:
a first plunger and a second plunger which are electrically connected to each other, one of the first and second plungers being adapted to be connected to an object to be inspected, the other of the first and second plungers being adapted to be connected to an inspecting board; and
a spring provided for the first and second plungers to urge the first and second plungers so as to be separated from each other, wherein:
the first plunger includes a distal end side columnar part, and a flange part which is provided at a side of a base end at a distance from a distal end; and
the flange part includes a first portion that has a first length from a center point of the flange part, which is greater than a radius of the distal end side columnar part, in a first direction perpendicular to an axial direction, and includes a second portion that has a second length from the center point, which is smaller than the radius of the distal end side columnar part, in a second direction perpendicular to the axial direction and different from the first direction;
the first portion and the second portion are arranged in a direction perpendicular to the axial direction; and
the first portion and the second portion are arranged in a circumferential direction.

2. The contact probe according to claim 1, wherein the flange part includes a third portion that has a third length, which is greater than a diameter of the distal end side columnar part, in the first direction, and includes a fourth portion that has a fourth length from, which is smaller than the diameter of the distal end side columnar part, in the second direction.

3. The contact probe according to claim 1, wherein the first plunger includes a small diameter part between the flange part and the distal end side columnar part, the small diameter part being in contact with a distal end face of the flange part, and having a smaller diameter than the distal end side columnar part.

4. A socket comprising:
a plurality of contact probes, each contact probe comprising:
a first plunger and a second plunger which are electrically connected to each other, one of the first and second plungers being adapted to be connected to an object to be inspected, the other of the first and second plungers being adapted to be connected to an inspecting board; and
a spring provided for the first and second plungers to urge the first and second plungers so as to be separated from each other, wherein:
the first plunger includes a distal end side columnar part, and a flange part which is provided at a side of a base end at a distance from a distal end; and
the flange part includes a first portion that has a first length from a center point of the flange part, which is greater than a radius of the distal end side columnar part, in a first direction perpendicular to an axial direction, and includes a second portion that has a second length from the center point, which is smaller than the radius of the distal end side columnar part, in a second direction perpendicular to the axial direction and different from the first direction; and an insulating support body which supports the plurality of contact probes, wherein the second portion of one of adjacent two of the plurality of contact probes is opposed to the second portion of the other of the adjacent two of the plurality of contact probes.

5. A socket comprising:

a plurality of contact probes, each contact probe comprising:

a first plunger and a second plunger which are electrically connected to each other, one of the first and second plungers being adapted to be connected to an object to be inspected, the other of the first and second plungers being adapted to be connected to an inspecting board; and a spring provided for the first and second plungers to urge the first and second plungers so as to be separated from each other, wherein:

the first plunger includes a distal end side columnar part, and a flange part which is provided at a side of a base end at a distance from a distal end; and the flange part includes a first portion that has a first length from a center point of the flange part, which is greater than a radius of the distal end side columnar part, in a first direction perpendicular to an axial direction, and includes a second portion that has a second length from the center point, which is smaller than the radius of the distal end side columnar part, in a second direction perpendicular to the axial direction and different from the first direction, wherein the flange part includes a third portion that has a third length, which is greater than a diameter of the distal end side columnar part, in the first direction, and includes a fourth portion that has a fourth length from, which is smaller than the diameter of the distal end side columnar part, in the second direction; and an insulating support body which supports the plurality of contact probes, wherein: adjacent two of the plurality of contact probes which are arranged in a third direction perpendicular to the axial direction and the first direction area first contact probe and a second contact probe; and the first and second contact probes are offset from each other in the first direction.

6. The socket according to claim 5, wherein a line interconnecting the first and second contact probes lies at an angle of about 45 degrees with respect to the first direction.

7. The socket according to claim 5, wherein both ends of the third portion of each of the plurality of the contact probe are tapered.

\* \* \* \* \*